(12) United States Patent
Willson

(10) Patent No.: US 8,645,441 B2
(45) Date of Patent: Feb. 4, 2014

(54) DESENSITIZED FILTERS

(75) Inventor: Alan N. Willson, Pasadena, CA (US)

(73) Assignee: Pentomics, Inc., Pasadena, CA (US)

( * ) Notice: Subject to any disclaimer, the term of this patent is extended or adjusted under 35 U.S.C. 154(b) by 1526 days.

(21) Appl. No.: 12/185,062

(22) Filed: Aug. 1, 2008

(65) Prior Publication Data

US 2010/0100576 A1    Apr. 22, 2010

Related U.S. Application Data

(60) Provisional application No. 60/953,355, filed on Aug. 1, 2007.

(51) Int. Cl.
*G06F 17/10* (2006.01)
*G06F 17/17* (2006.01)

(52) U.S. Cl.
USPC .......................................... 708/300; 708/313

(58) Field of Classification Search
USPC ........... 708/300, 313, 819; 341/143; 375/222, 375/229
See application file for complete search history.

(56) References Cited

U.S. PATENT DOCUMENTS

| | | | | |
|---|---|---|---|---|
| 3,908,114 | A * | 9/1975 | White | 708/400 |
| 4,902,979 | A * | 2/1990 | Puckette, IV | 329/343 |
| 4,953,118 | A * | 8/1990 | Gockler | 708/300 |
| 5,034,962 | A * | 7/1991 | Yamamoto et al. | 375/222 |
| 5,177,700 | A * | 1/1993 | Gockler | 708/313 |
| 5,621,675 | A | 4/1997 | Linz et al. | |
| 5,646,621 | A | 7/1997 | Cabler et al. | |
| 5,751,615 | A | 5/1998 | Brown | |
| 5,880,687 | A * | 3/1999 | May et al. | 341/61 |
| 5,880,980 | A | 3/1999 | Rothacher et al. | |
| 6,111,531 | A * | 8/2000 | Farag | 341/143 |
| 6,137,349 | A * | 10/2000 | Menkhoff et al. | 327/552 |
| 6,163,787 | A * | 12/2000 | Menkhoff | 708/313 |
| 6,226,322 | B1 * | 5/2001 | Mukherjee | 375/229 |
| 6,279,019 | B1 * | 8/2001 | Oh et al. | 708/300 |
| 6,307,903 | B1 | 10/2001 | Harris et al. | |
| 6,313,773 | B1 * | 11/2001 | Wilson et al. | 341/143 |
| 6,473,011 | B1 * | 10/2002 | Steensgaard-Madsen | 341/118 |
| 6,584,162 | B1 * | 6/2003 | Tinker | 375/355 |
| 6,950,049 | B2 * | 9/2005 | Brooks et al. | 341/143 |

(Continued)

OTHER PUBLICATIONS

H. G. Gockler and S. Damjanovic, "A family of efficient complex halfband filters," in Proc. 4th Karlsruhe Workshop on Software Radios, Karlsruhe, Germany, 2006, pp. 79-88.*

(Continued)

*Primary Examiner* — Chuong D Ngo
*Assistant Examiner* — Matthew Sandifer
(74) *Attorney, Agent, or Firm* — Sterne, Kessler, Goldstein & Fox P.L.L.C.

(57) ABSTRACT

A method and system for the design and implementation of filters is presented in which the filter's transfer function can be provided with a significant insensitivity to the filter's tap coefficient values. A desensitized digital filter includes a first halfband filter and a second filter coupled in cascade between an input of the digital filter and the output of the digital filter. In embodiments, the first filter has the transfer function $F(z)=K(1+z^{-1})(1+z^{-1})$ wherein $K\neq 0$ is a scale factor. The digital filter may also interact with an up-sampler or a down-sampler. A desensitized Hilbert transformer includes an FIR filter having filter-tap coefficients whose absolute values equal the absolute values of the coefficients of an FIR filter $F(z)$ for which the product $(1+z^{-1})F(z)$ is a halfband filter coupled in cascade with a second filter.

30 Claims, 26 Drawing Sheets

Desensitized implementation of a 15-tap halfband anti-imaging filter along with a data-rate expander.

(56) References Cited

U.S. PATENT DOCUMENTS

| | | | | |
|---|---|---|---|---|
| 6,993,464 | B2* | 1/2006 | Chiu et al. | 703/2 |
| 7,024,447 | B2* | 4/2006 | Pisati et al. | 708/819 |
| 7,026,970 | B2* | 4/2006 | Wang et al. | 341/143 |
| 7,035,888 | B2* | 4/2006 | Lee | 708/313 |
| 7,814,137 | B1* | 10/2010 | Mauer | 708/300 |
| 2001/0037353 | A1* | 11/2001 | Pisati et al. | 708/819 |
| 2002/0133524 | A1* | 9/2002 | Schmidt | 708/313 |
| 2003/0103560 | A1* | 6/2003 | Buch et al. | 375/229 |
| 2003/0187894 | A1* | 10/2003 | Wang | 708/313 |
| 2005/0280564 | A1 | 12/2005 | Lee | |
| 2007/0094317 | A1 | 4/2007 | Wang | |
| 2010/0235420 | A1 | 9/2010 | Willson, Jr. | |

OTHER PUBLICATIONS

M. D. Lutovac and Ljiljana D. Milic, "Approximate Linear Phase Multiplierless IIR Halfband Filter," IEEE Trans. Sig. Proc. Lettrs., vol. 7, 2000, pp. 52-53.*

Xilinx Inc., "Distributed Arithmetic FIR Filter v9.0", data sheet DS240, 2005.*

A. N. Willson Jr. and H. J. Orchard, "A design method for half-band FIR filters", IEEE Trans. Circuits Syst. I, vol. 46, pp. 95-101, 1999.*

A. N. Willson Jr., "Desensitized halfband interpolation filters", Proc. Midwest Symp. Circuits Syst., pp. 1034-1037, 2007.*

A. N. Willson Jr., "Desensitized half-band filters", IEEE Trans. Circuits Syst. I, Reg. Papers, vol. 57, No. 1, pp. 152-165, 2010.*

"AD9776/AD9778/AD9779 Data Sheet," Analog Devices, Rev. A, Mar. 2007; 56 pages.

Adams, J.W., et al., "A New Approach to FIR Digital Filters with Fewer Multipliers and Reduced Sensitivity," IEEE Transactions on Circuits and Systems, vol. CAS-30, No. 5, May 1983; pp. 277-283.

Aktan, M., et al., "An Algorithm for the Design of Low-Power Hardware-Efficient FIR Filters," IEEE Transactions on Circuits and Systems I: Regular Papers, vol. 55, Jul. 2008; pp. 1536-1545.

Brandt, B.P., et al., "A Low Power, Area-Efficient Digital Filter for Decimation and Interpolation," IEEE Journal of Solid-State Circuits, vol. 29, No. 6, Jun. 1994; pp. 679-687.

Chen, C.-L., et al., "A Trellis Search Algorithm for the Design of FIR Filters with Signed-Powers-of-Two Coefficients," IEEE Transactions on Circuits and Systems-II: Analog and Digital Signal Processing, vol. 46, No. 1, Jan. 1999; pp. 29-39.

Dempster, A.G., et al., "Use of Minimum-Adder Multiplier Blocks in FIR Digital Filters," IEEE Transactions on Circuits and Systems-II: Analog and Digital Signal Processing, vol. 42, No. 9, Sep. 1995; pp. 569-577.

Gao, Y., et al., "A Partial-Polyphase VLSI Architecture for Very High Speed CIC Decimation Filters," Proceedings of 12th Annual IEEE International ASIC/SOC Conference, 1999; pp. 391-395.

Goodman, D.J., "Nine Digital Filters for Decimation and Interpolation," IEEE Transactions on Acoustics, Speech, and Signal Processing, vol. ASSP-25, No. 2, Apr. 1977; pp. 121-126.

Grati, K., et al., "Design and implementation of cascade decimation filter for radio communications," Proceedings of IEEE Conference on Electronics Circuits and Systems (ICECS '2001), vol. III, Sep. 2001; pp. 1603-1606.

Gustafsson, "A Difference Based Adder Graph Heuristic for Multiple Constant Multiplications Problems," Proceedings of the IEEE International Symposium on Circuits and Systems (ISCAS 2007), May 2007; pp. 1097-1100.

Gustafsson, "Lower Bounds for Constant Multiplication Problems," IEEE Transactions on Circuits and Systems-II, vol. 54, No. 11, Nov. 2007; pp. 974-978.

Gustafsson, O., et al., "On the Design of Sparse Half-Band Like FIR Filters," Conference Record of the Forty-First Asilomar Conference on Signals, Systems and Computers, 2007; pp. 1098-1102.

Gustafsson, O., et al., "On the Use of Multiple Constant Multiplication in Polyphase FIR Filters and Filter Banks," Proceedings of the 6th Nordic Signal Processing Symposium—NORSIG 2004, Jun. 2004; pp. 53-56.

Hogenauer, E.B., "An Economical Class of Digital Filters for Decimation and Interpolation," IEEE Transactions on Acoustics, Speech, and Signal Processing, vol. ASSP-29, No. 2, Apr. 1981; pp. 155-162.

Kwentus, A.Y., et al., "Application of Filter Sharpening to Cascaded Integrator-Comb Decimation Filters," IEEE Transactions on Signal Processing, vol. 45, No. 2, Feb. 1997; pp. 457-467.

Liu, X., et al., "A 1.2 Gb/s Recursive Polyphase Cascaded Integrator-Comb Prefilter for High Speed Digital Decimation Filters, in 0.18-μm CMOS," Proceedings of the 2010 IEEE International Symposium on Circuits and Systems (ISCAS), 2010; pp. 2115-2118.

Lyons, R., "Understanding cascaded integrator-comb filters," Mar. 31, 2005; 9 pages.

Mitra, S.K., "Digital Signal Processing," 3rd Edition, McGraw-Hill, 2006; Section 13.6.5, pp. 787-790, and Section 15.7, pp. 893-899.

Renfors, M., et al., "Recursive N-th Band Digital Filters-Part I: Design and Properties," IEEE IEEE Transactions on Circuits and Systems, vol. CAS-34, No. 1, Jan. 1987; pp. 24-39.

Renfors, M., et al., "Recursive N-th Band Digital Filters-Parts II: Design of Multistage Decimators and Interpolators," IEEE Transactions on Circuits and Systems, vol. CAS-34, No. 1, Jan. 1987; pp. 40-51.

Schussler, H.W., et al., "Halfband filters and Hilbert Transformers," Circuits Systems Signal Processing, vol. 17, No. 2, 1998; pp. 137-164.

Yamashita, R., et al., "Design of IIR Half-Band Filters with Arbitrary Flatness and Its Application to Filter Banks," Electronics and Communications in Japan, Part 3, vol. 87, No. 1, 2004; pp. 10-18.

Non-Final Rejection mailed Feb. 23, 2013 for U.S. Appl. No. 12/731,122, filed Mar. 24, 2010; 19 pages.

* cited by examiner

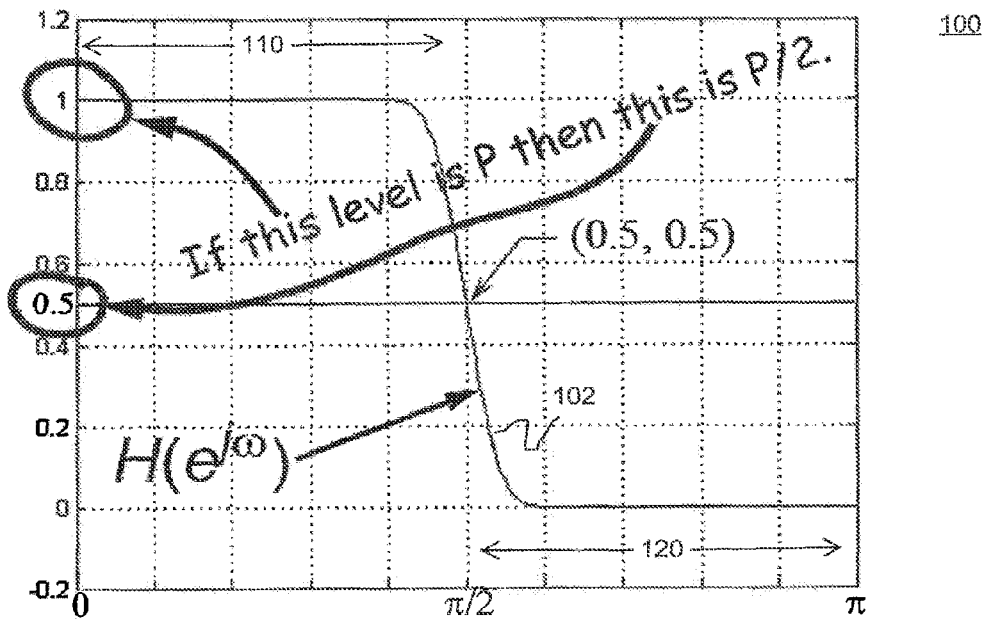
Fig. 1. A halfband filter.
Prior Art
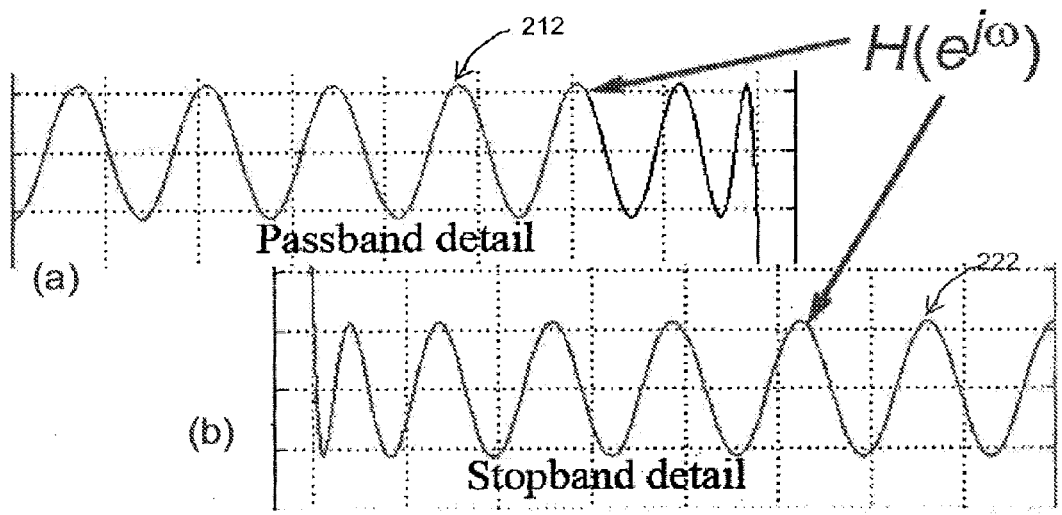
Fig. 2. A halfband filter. (a) Passband detail. (b) Stopband detail.
Prior Art Smallest halfband filter (N = 1):
$$z^{-1}(h_1 z^1 + h_0 + h_1 z^{-1})$$
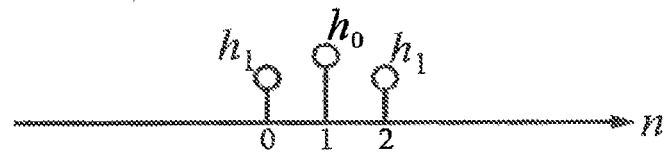
Fig. 3. A 3-tap halfband filter.
Prior Art
Next-smallest halfband filter (N = 3):
$$z^{-3}(h_3 z^3 + h_1 z^1 + h_0 + h_1 z^{-1} + h_3 z^{-3})$$
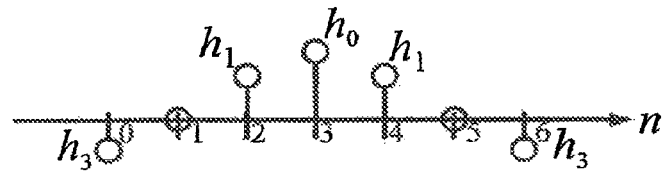
Fig. 4. A 7-tap halfband filter. Prior Art
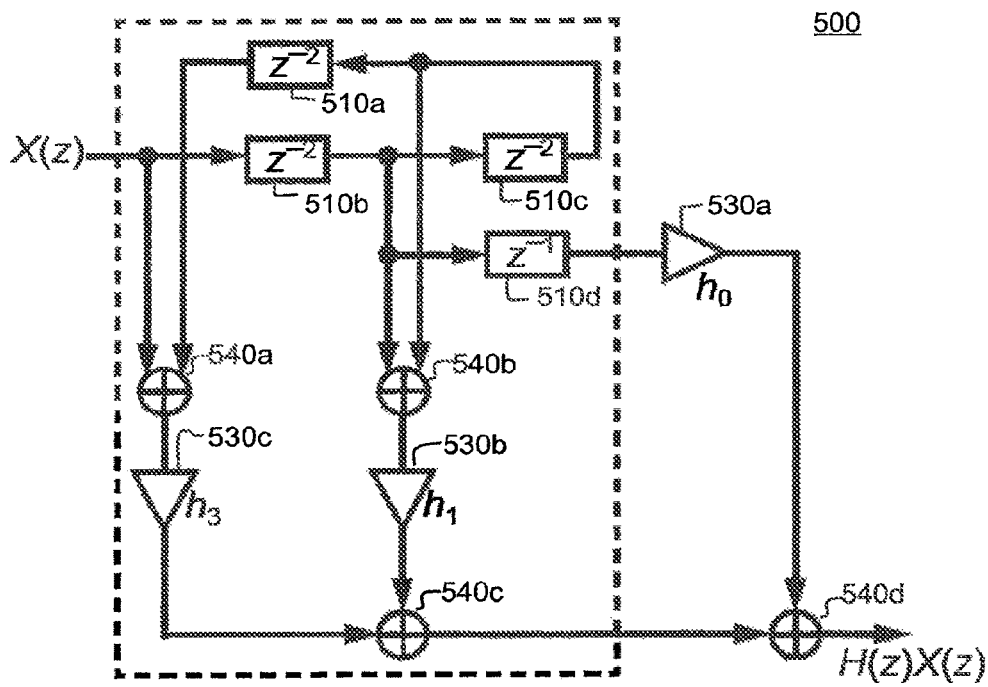
Fig. 5. Implementation of a 7-tap halfband filter.

(a)
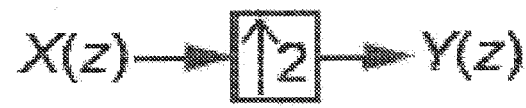
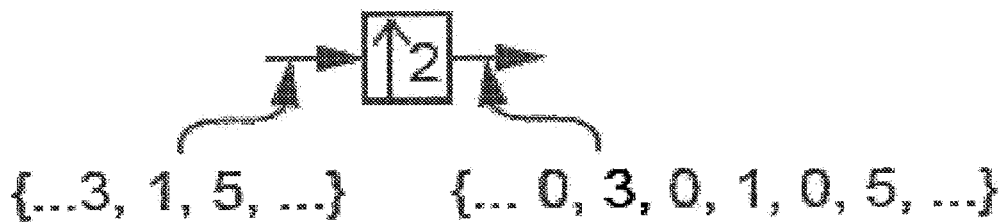
(b)
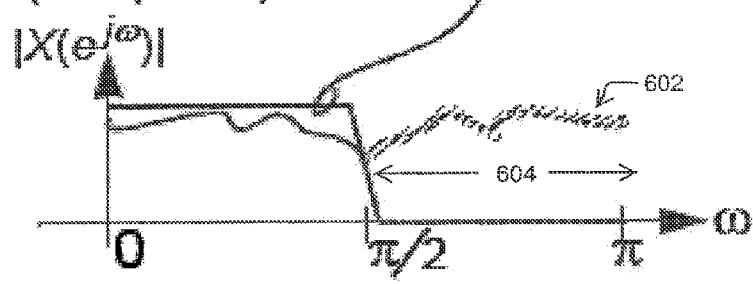
(c)
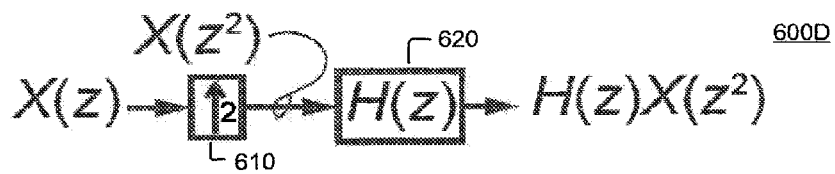
(d)
Fig. 6. Halfband filter and up-sampler. (a) Up-sampler mathematics.
(b) Up-sampler operation. (c) Halfband anti-imaging filter.
(d) Mathematical relations for up-sampler system.
Prior Art

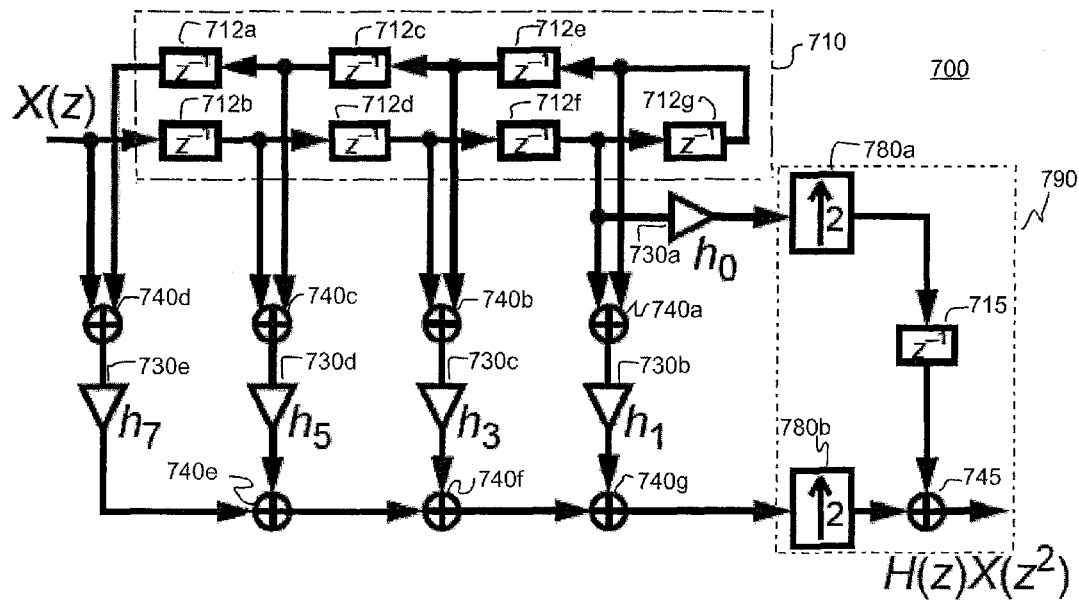
Fig. 7. Implementation of a 15-tap halfband anti-imaging filter along with a data-rate expander.
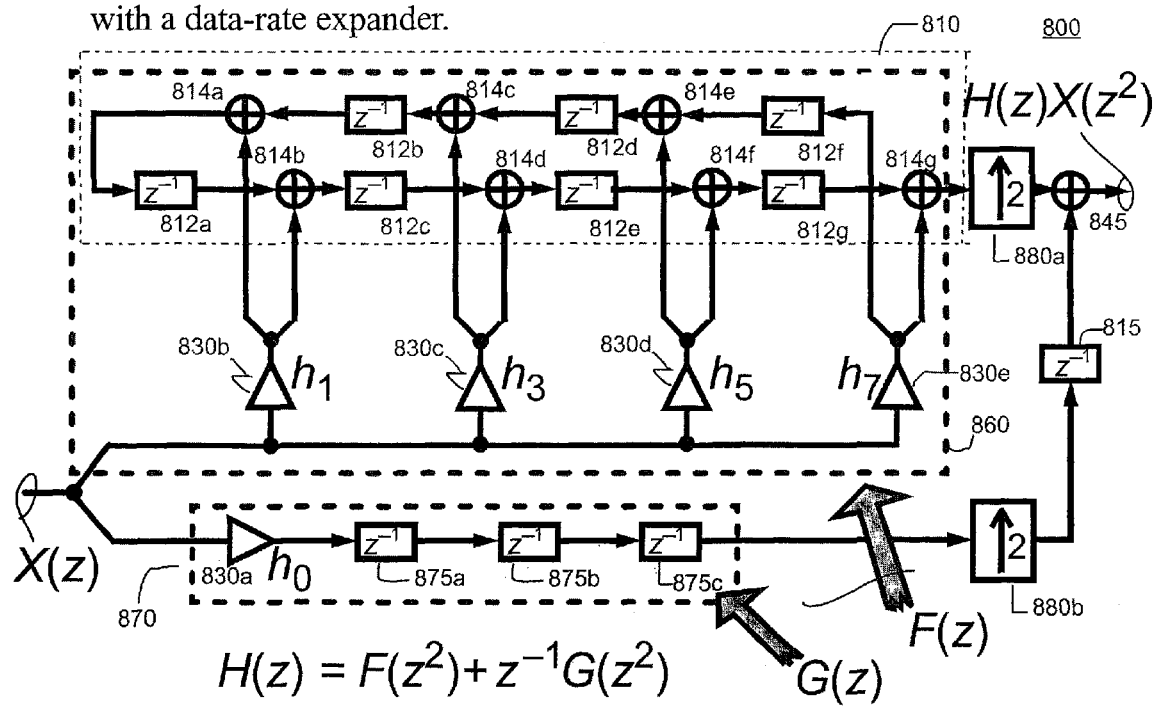
Fig. 8. Implementation of the 15-tap halfband anti-imaging filter in the transposed form.

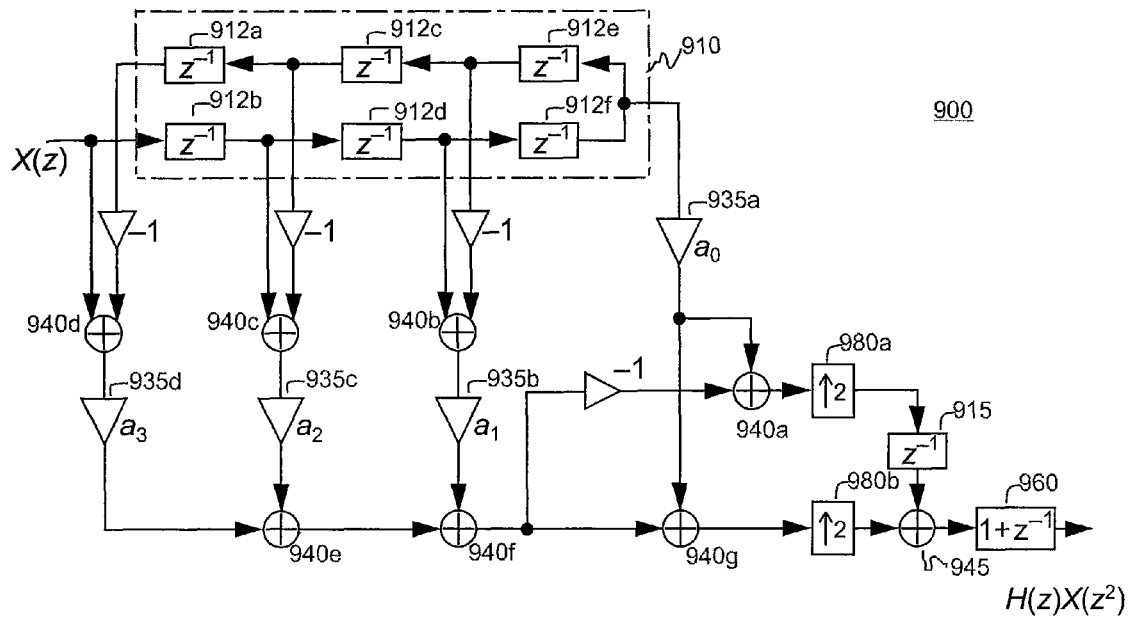
Fig. 9. Desensitized implementation of a 15-tap halfband anti-imaging filter along with a data-rate expander.
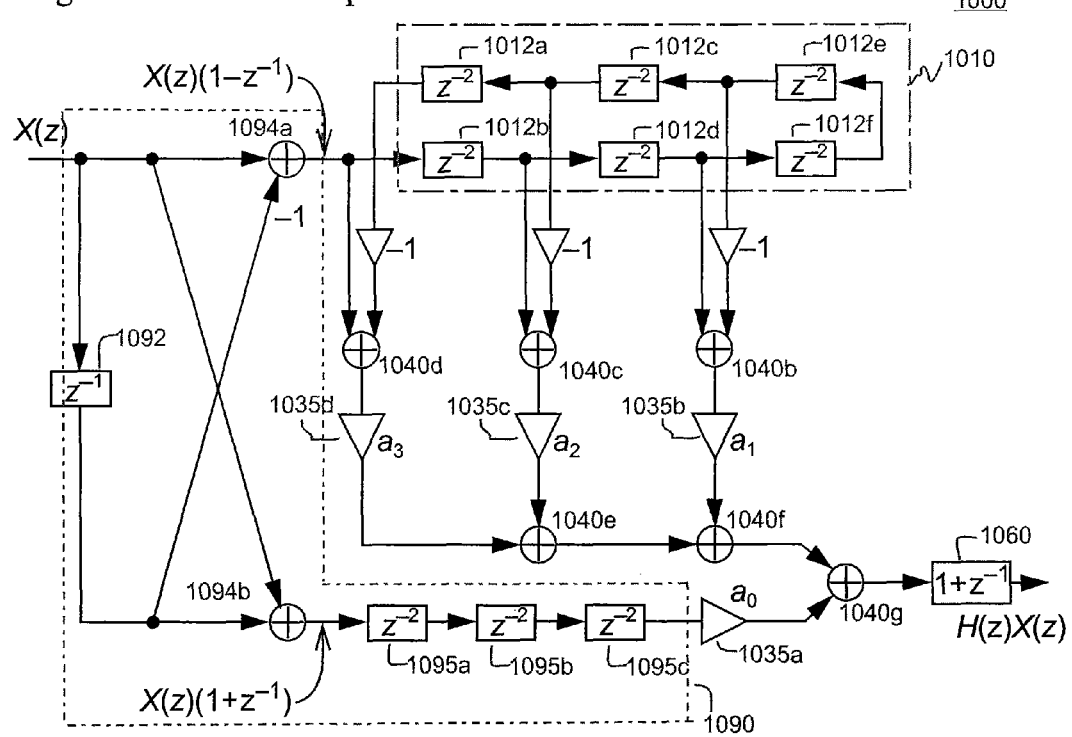
Fig. 10. Alternative implementation of a desensitized 15-tap halfband filter.

Let: 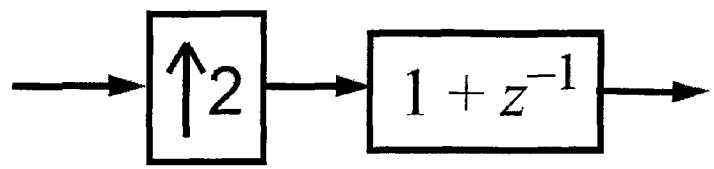
be denoted as: 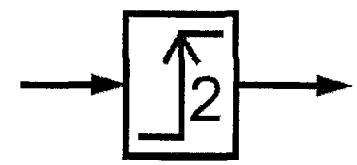
(sample-and-hold up-sampler)
Fig. 11. Definition of a sample-and-hold up-sampler.
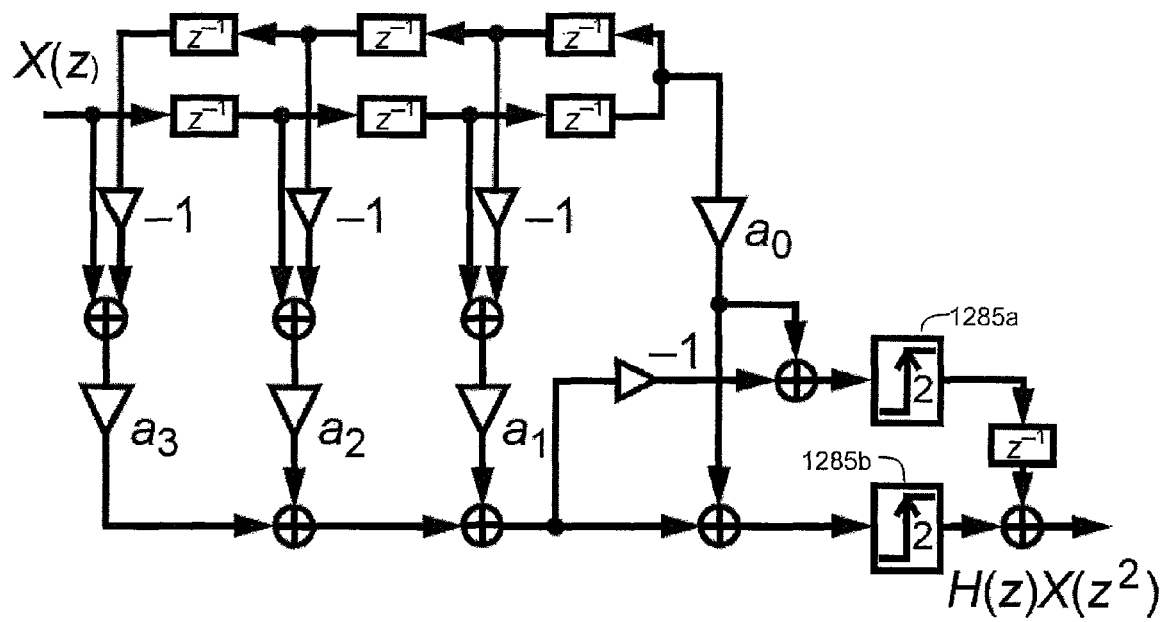
Fig. 12. Alternate implementation of a 15-tap desensitized halfband anti-imaging filter, using sample-and-hold up-samplers.

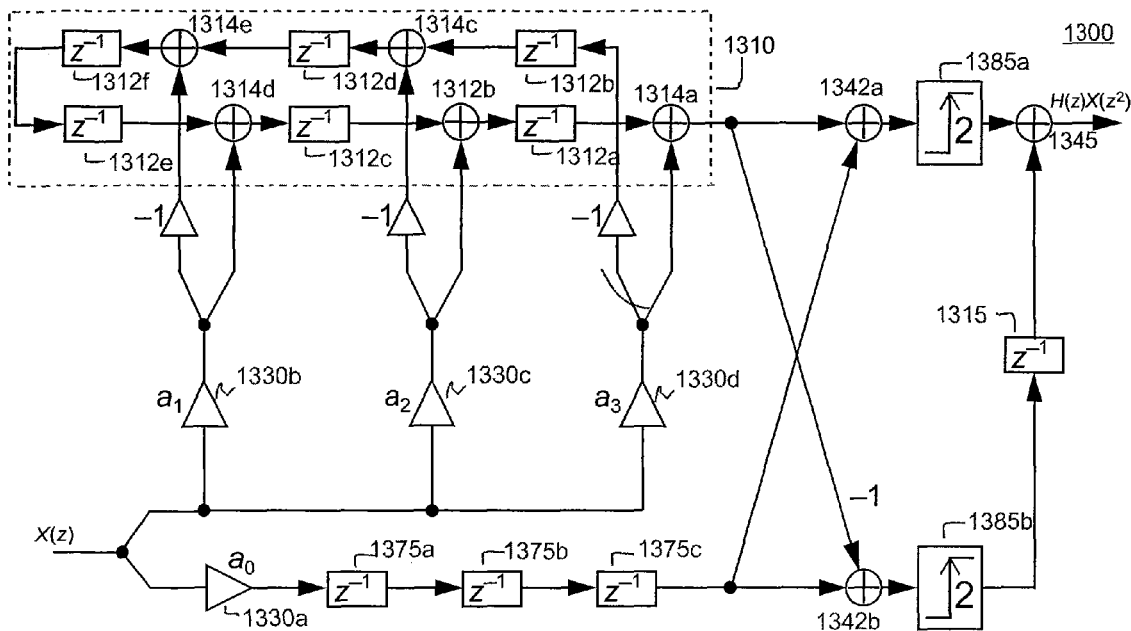
Fig. 13. Transposed implementation of a desensitized 15-tap halfband filter.
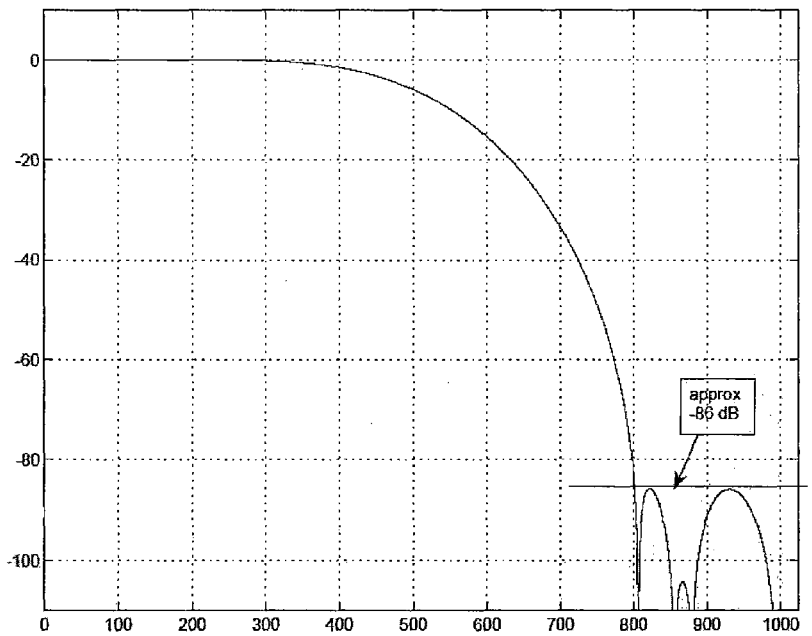
Fig. 14. Frequency response of 15-tap Analog Devices halfband filter. Both ideal and 13-bit coefficients for the conventional structure, as well as 10-bit coefficients for desensitized halfband structure, exhibit this same response.

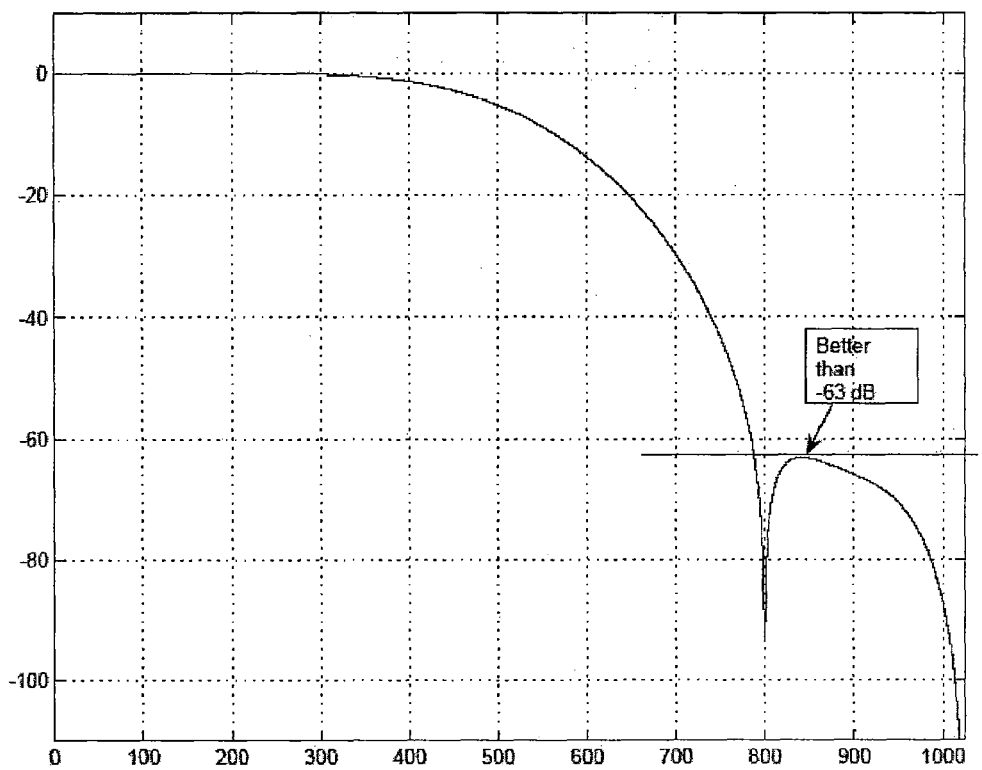
Fig. 15. Frequency response of 15-tap Analog Devices halfband filter implemented with the conventional structure using 10-bit tap coefficient quantization.

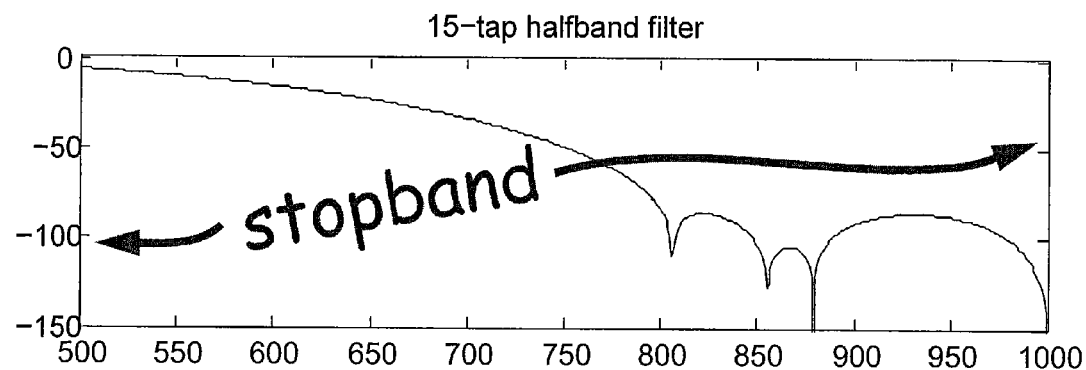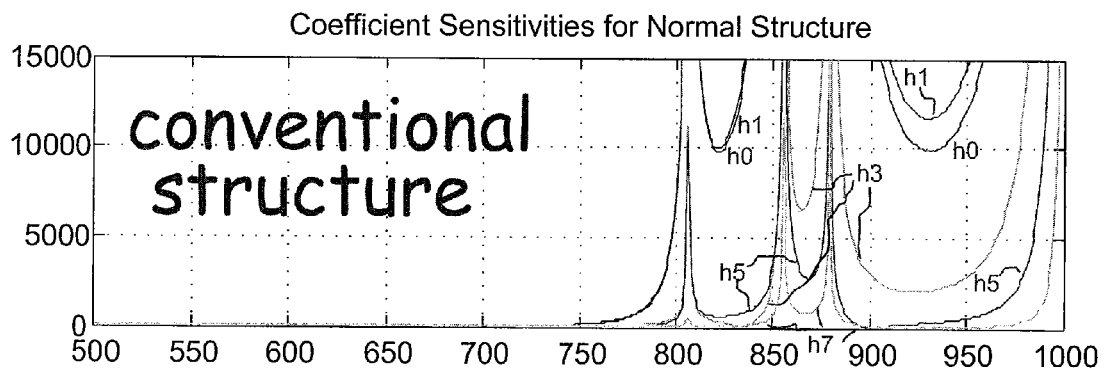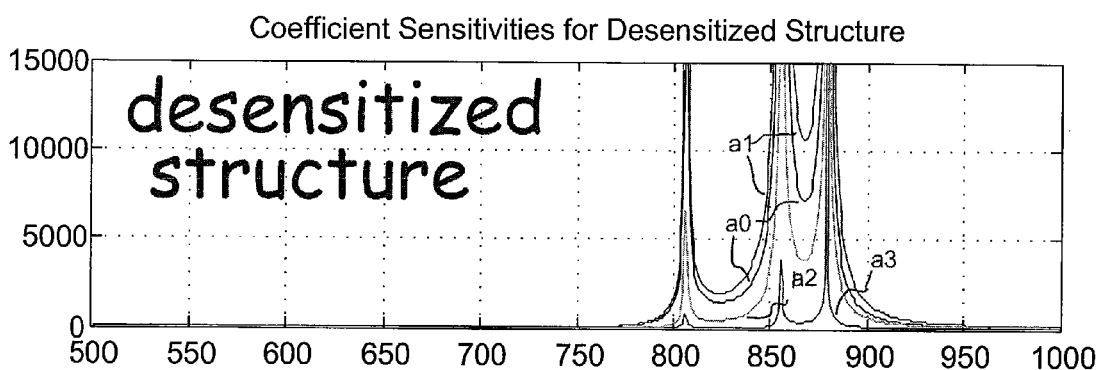
Fig. 16. Sensitivity plots for 15-tap Analog Devices halfband filter.

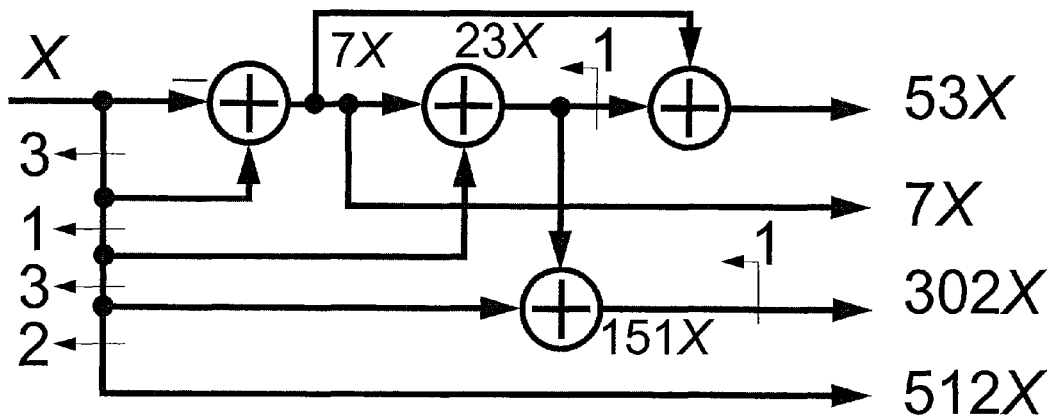
Fig. 17. Four adders in a depth-three MCM tree suffice to realize the filter's multipliers when implementing the conventional structure.
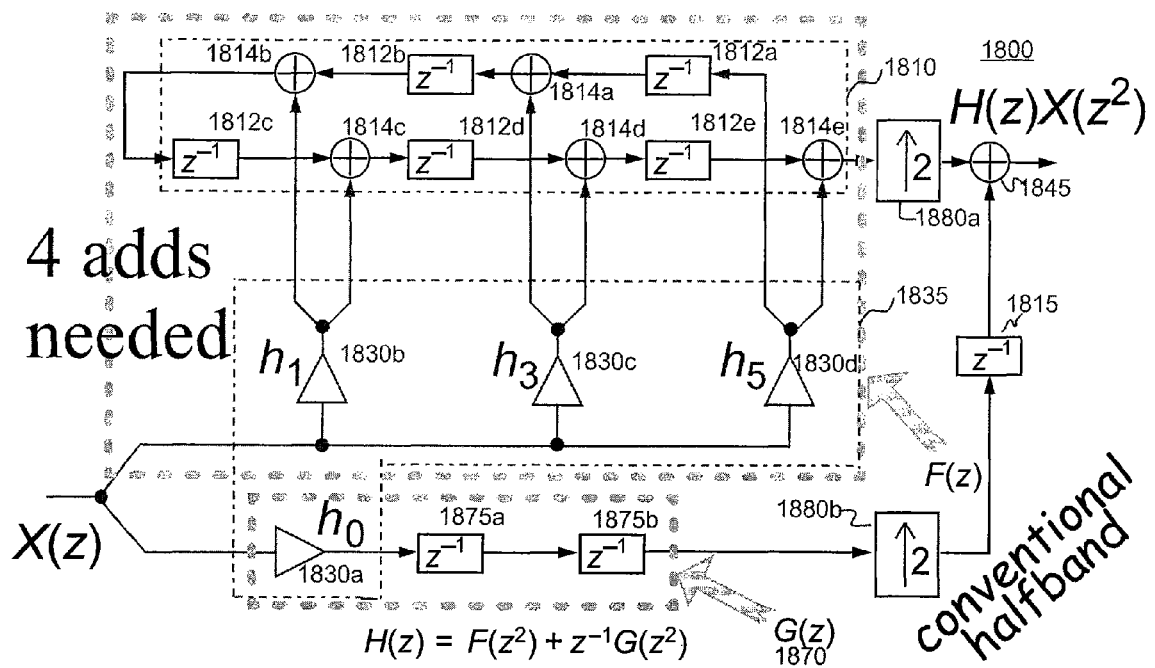
Fig. 18. The four-adder tree can implement all four multipliers in the the 11-tap conventional transformed halfband structure.

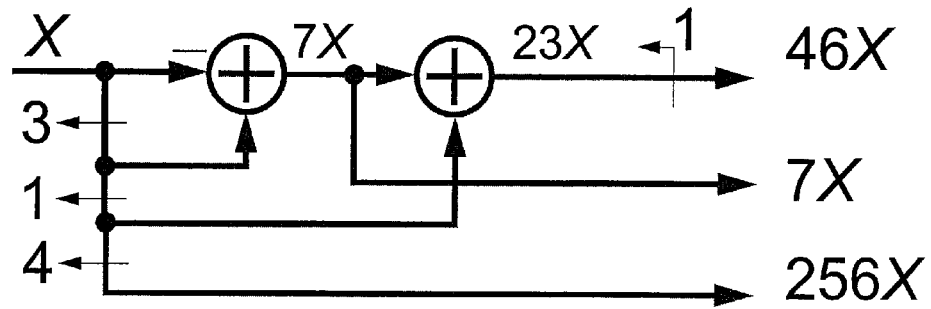
Fig. 19. Two adders in a depth-two MCM tree suffice to realize the filter's multipliers when implementing the desensitized structure.
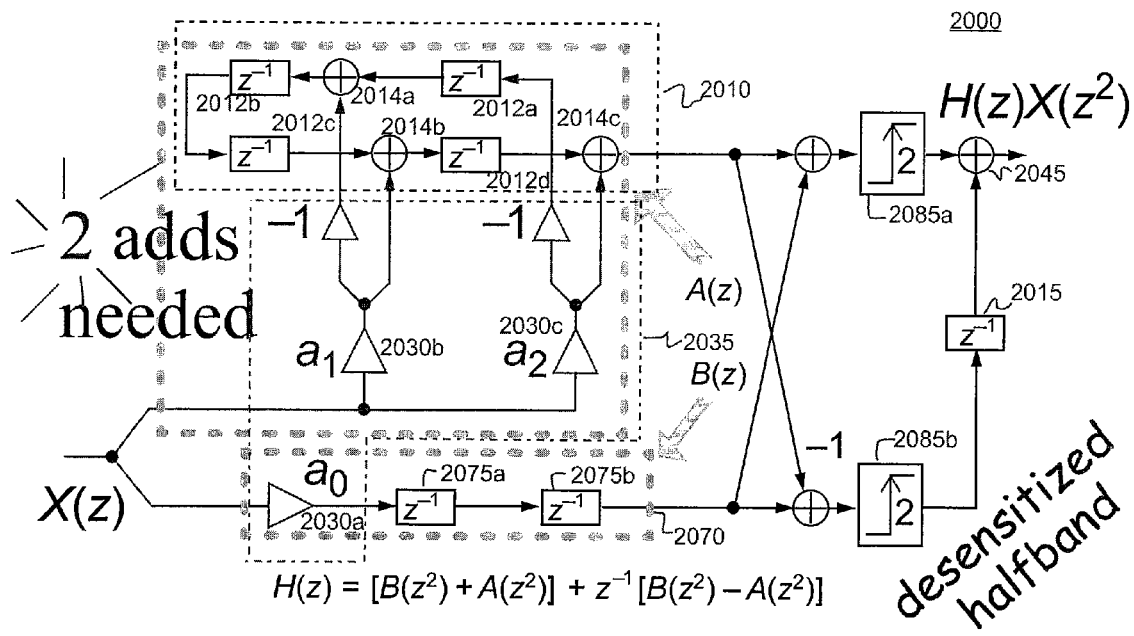
Fig. 20. The two-adder tree can implement all three multipliers in the the 11-tap desensitized transformed halfband structure.

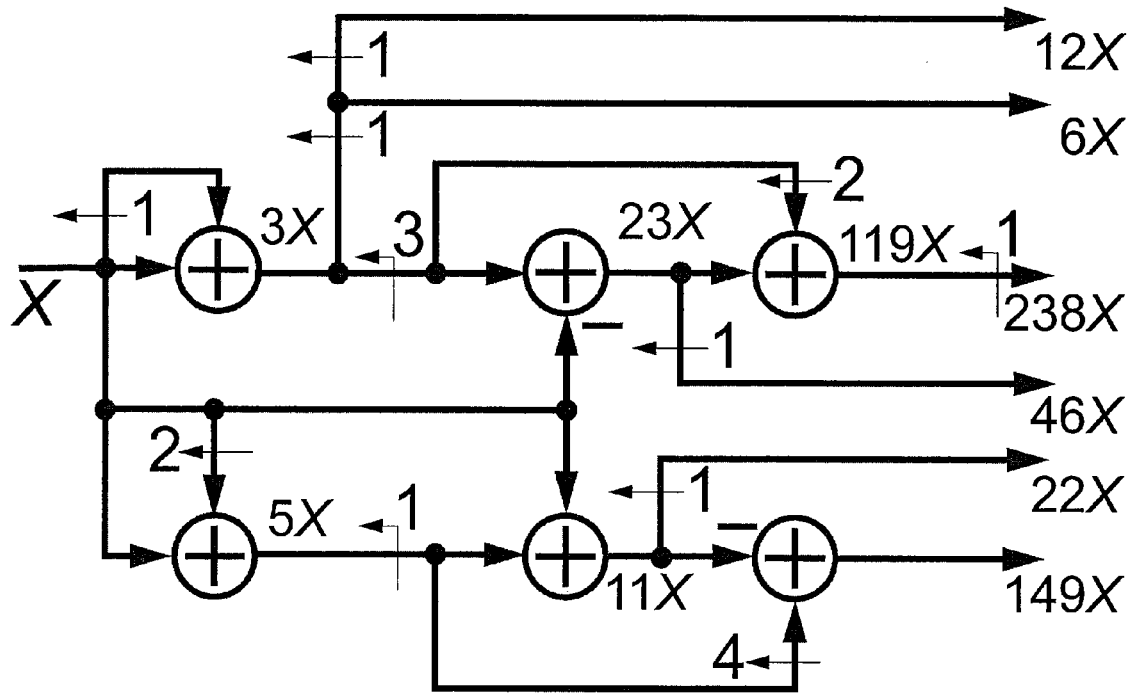
Fig. 21. Six adders in a depth-three MCM tree suffice to realize the filter's multipliers when implementing the conventional structure.
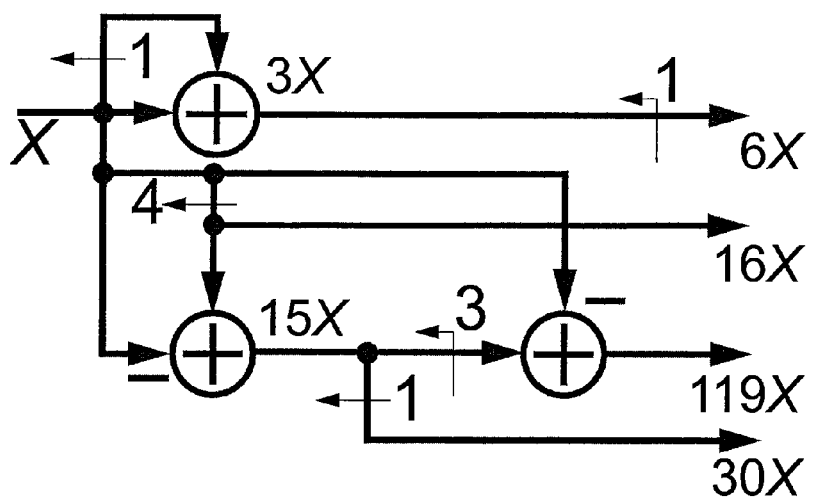
Fig. 22. Three adders in a depth-two MCM tree suffice to realize the filter's multipliers when implementing the desensitized structure.

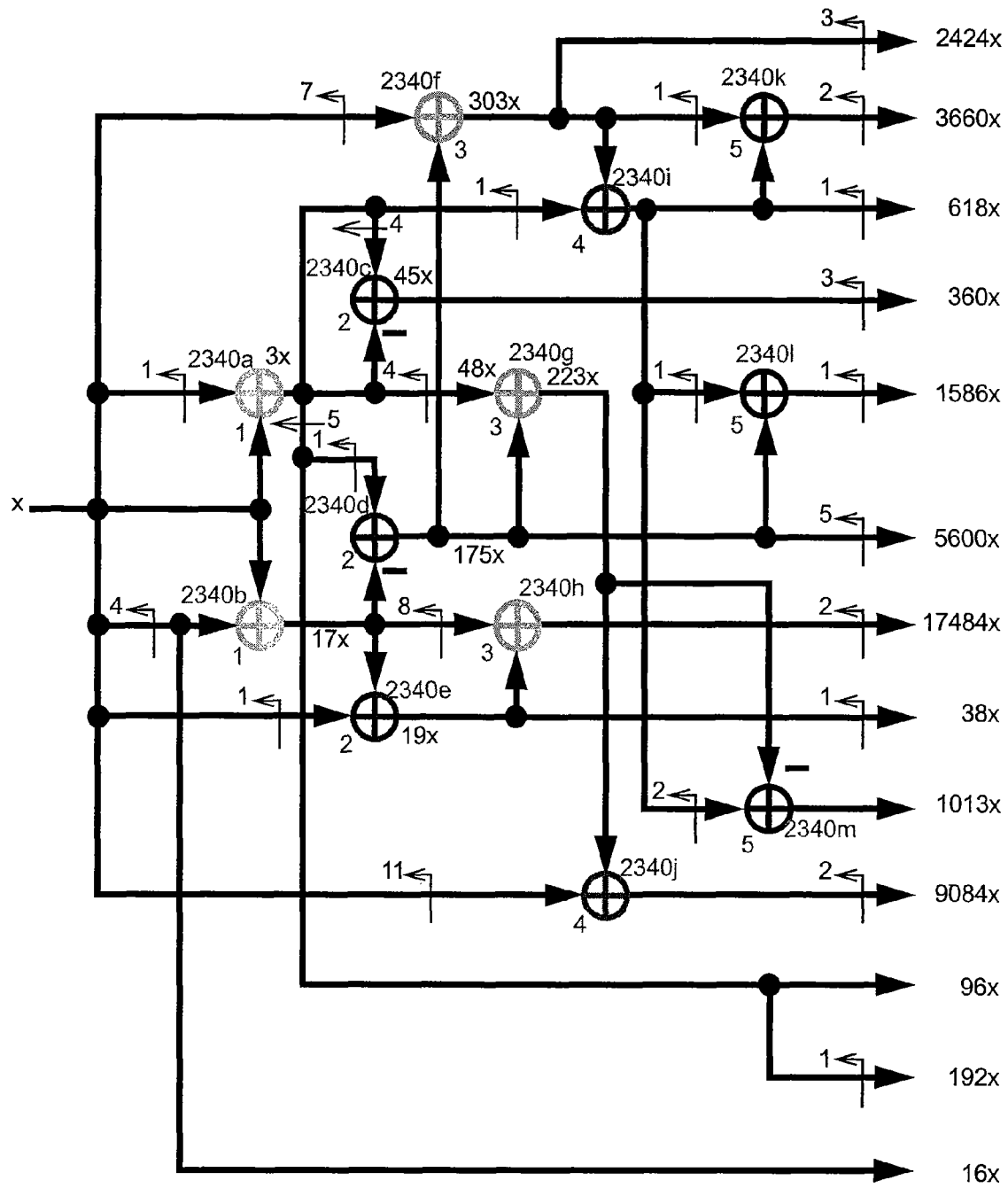
Fig. 23. Thirteen adders in a depth-five tree suffice to realize the filter's multipliers when implementing the desensitized structure.

$$h_{23} = -2^{-12} - 2^{-14} - 2^{-16}$$

$$h_{21} = 2^{-10} - 2^{-13} - 2^{-15}$$

$$h_{19} = -2^{-9} + 2^{-13} + 2^{-14}$$

$$h_{17} = 2^{-8} - 2^{-11} - 2^{-14}$$

$$h_{15} = -2^{-7} + 2^{-9} + 2^{-14} - 2^{-16}$$

$$h_{13} = 2^{-7} + 2^{-9} - 2^{-12} - 2^{-16}$$

$$h_{11} = -2^{-6} + 2^{-11} + 2^{-12} - 2^{-16}$$

$$h_{9} = 2^{-6} + 2^{-7} - 2^{-11} - 2^{-13}$$

$$h_{7} = -2^{-5} - 2^{-8} + 2^{-13} + 2^{-15}$$

$$h_{5} = 2^{-4} - 2^{-7} + 2^{-10} + 2^{-14}$$

$$h_{3} = -2^{-4} - 2^{-5} - 2^{-7} + 2^{-11}$$

$$h_{1} = 2^{-2} + 2^{-4} + 2^{-8} - 2^{-12}$$

$$h_{0} = 2^{-1} - 2^{-10} + 2^{-12} - 2^{-15}$$

Fig. 24. SPT multiplier coefficients for THF (from Ref. [8]).

$$a_{11} = -2^{-13} - 2^{-14}$$

$$a_{10} = 2^{-12} + 2^{-13}$$

$$a_9 = -2^{-10} + 2^{-15}$$

$$a_8 = 2^{-9} - 2^{-12} + 2^{-14}$$

$$a_7 = -2^{-9} - 2^{-10} - 2^{-12}$$

$$a_6 = 2^{-7} - 2^{-9} - 2^{-11} - 2^{-14}$$

$$a_5 = -2^{-7} - 2^{-10} + 2^{-12} + 2^{-14}$$

$$a_4 = 2^{-6} - 2^{-9} - 2^{-11}$$

$$a_3 = -2^{-6} - 2^{-8} - 2^{-10} - 2^{-12}$$

$$a_2 = 2^{-5} + 2^{-9} + 2^{-10}$$

$$a_1 = -2^{-4} - 2^{-8} - 2^{-14}$$

$$a_0 = 2^{-2}$$

Fig. 25. Desensitized-47 SPT multiplier coefficients.

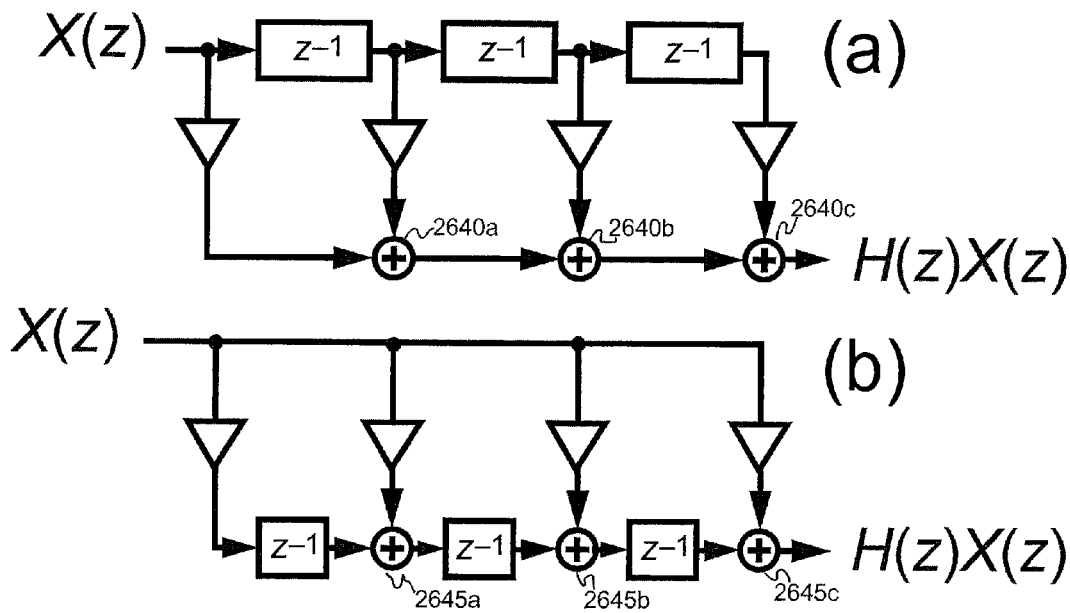
Fig. 26. FIR filters: (a) direct form; (b) transposed form.
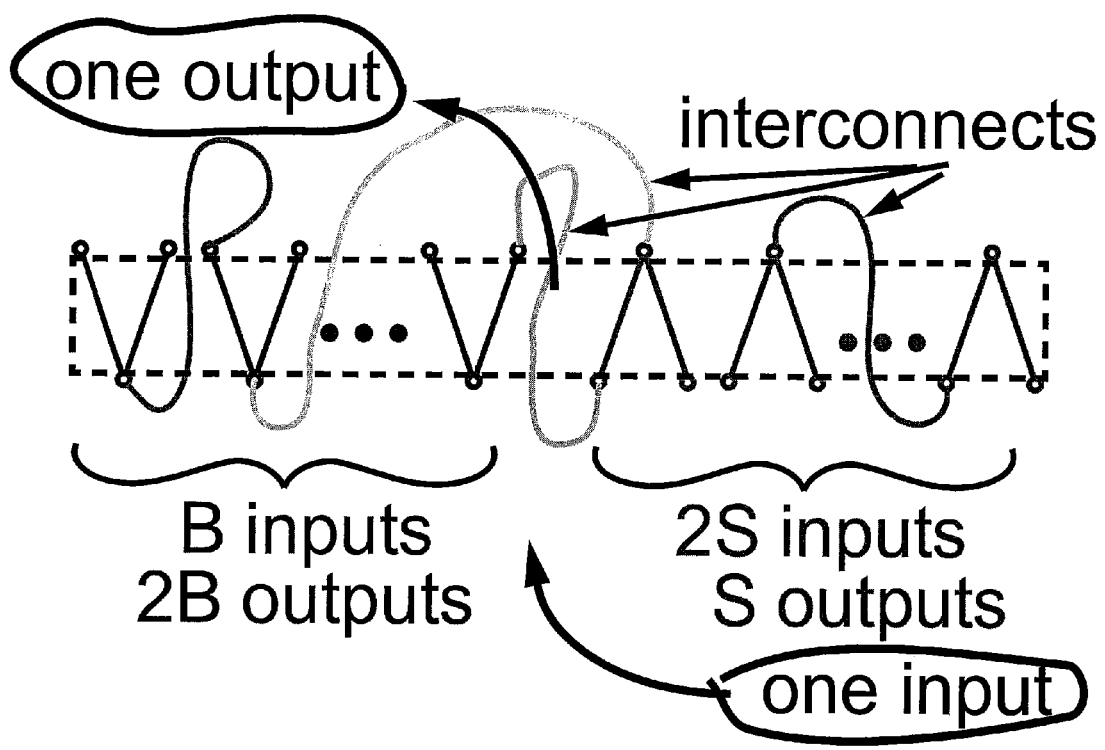
Fig. 27. Array of B branch nodes and S sum nodes.

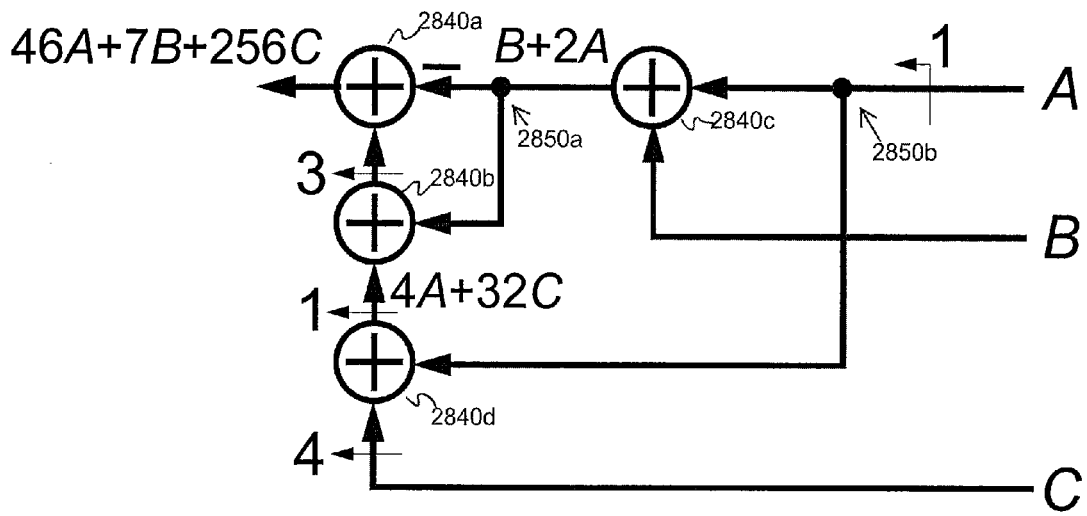
Fig. 28. Transpose of Fig. 19 MCM block.
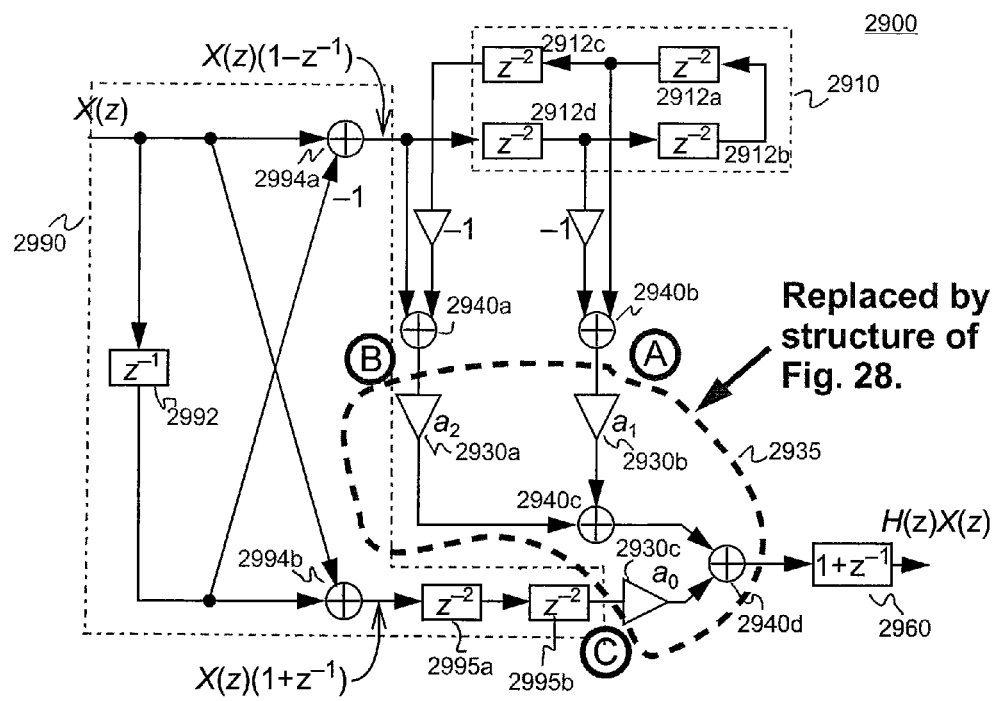
Fig. 29. Implementation of a desensitized 11-tap halfband filter for which the filter of Fig. 20 is the transpose.

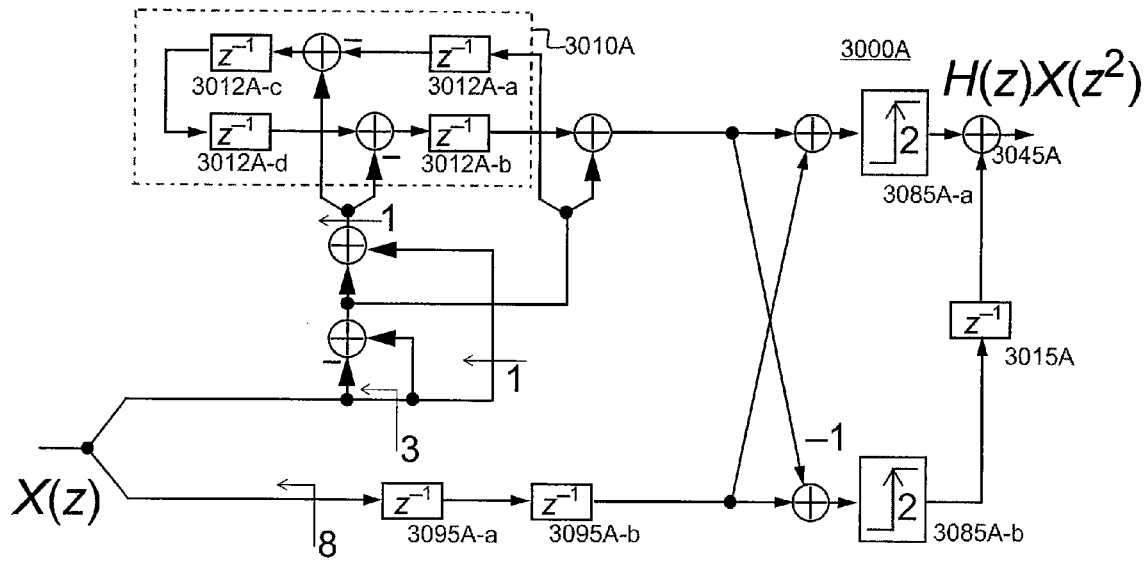
Fig. 30(a). The 11-tap desensitized version of Goodman's F7 halfband filter, realized in a transposed form using the Fig. 13 structure.
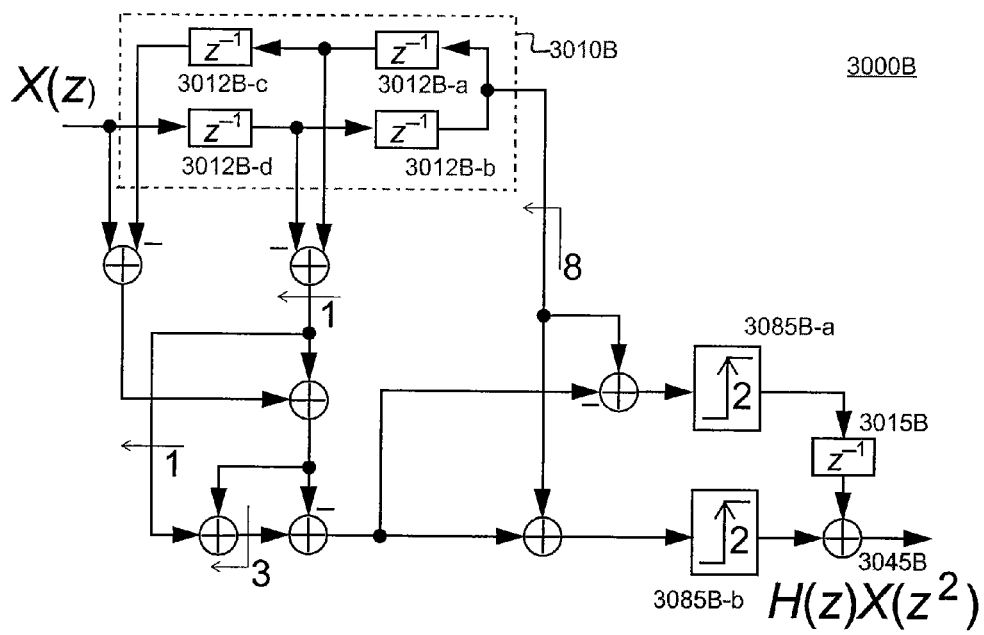
Fig. 30(b). The 11-tap desensitized version of Goodman's F7 halfband filter, realized in a direct form using the Fig. 12 structure.

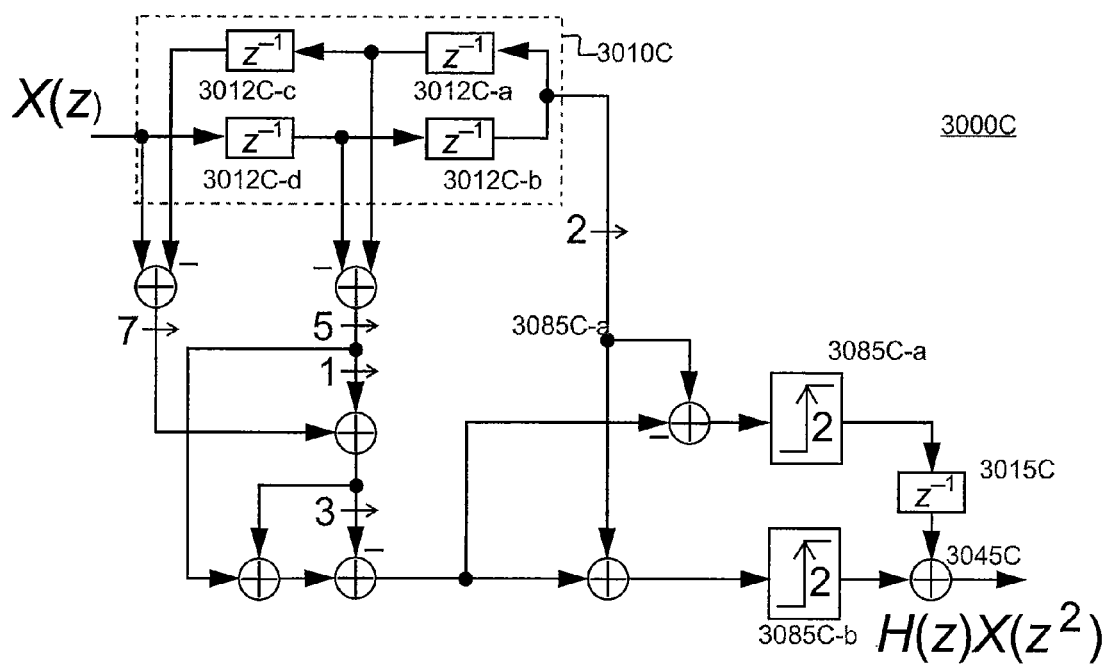
Fig. 30(c). Interpolator using Goodman's 11-tap F7 halfband filter, desensitized and using fractional coefficients implemented as hardwired rightward bit-shifts, and requiring a total of 8 adders.

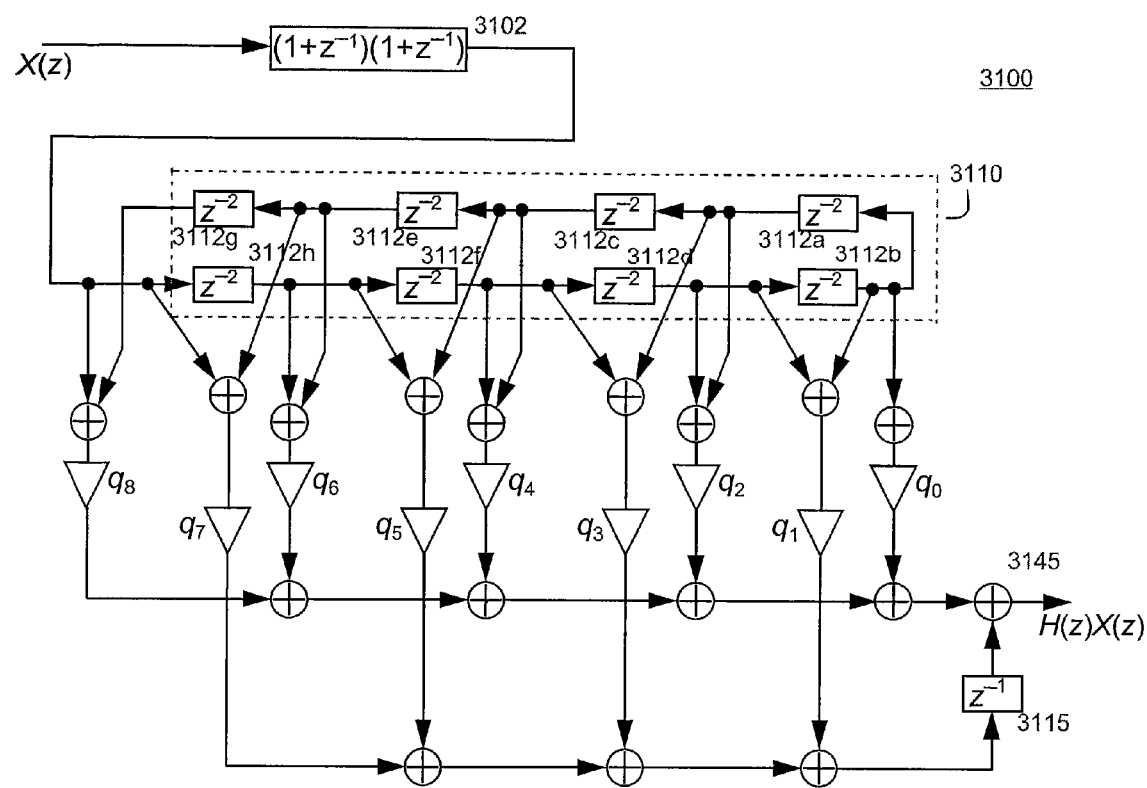
FIG. 31  Alternate implementation of a desensitized 19-tap halfband filter.

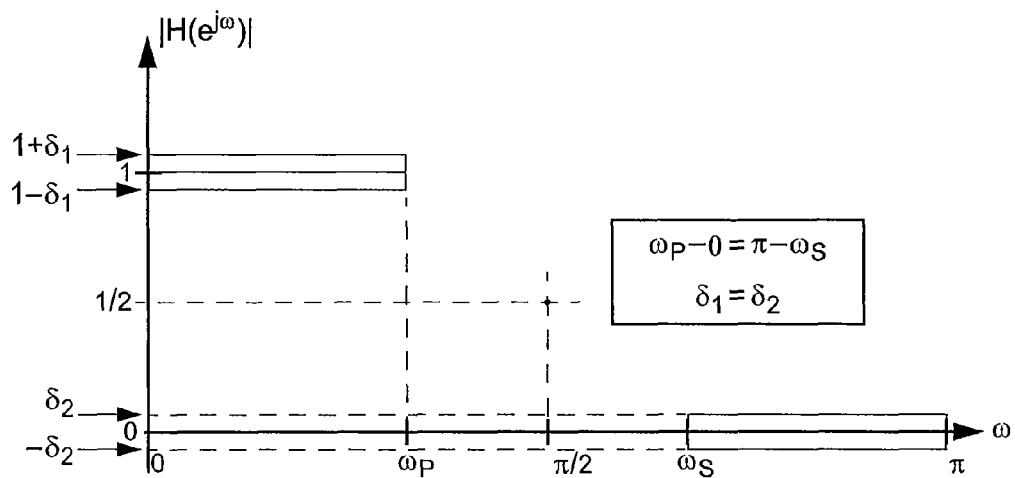
FIG. 32  General alignment of passband and stopband in a halfband filter.
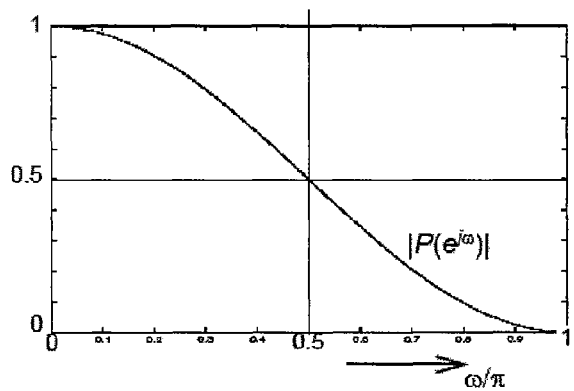
FIG. 33  Magnitude of frequency response of the smallest halfband filter wherein $P(z) = 1/4 + 1/2z^{-1} + 1/4z^{-2}$.

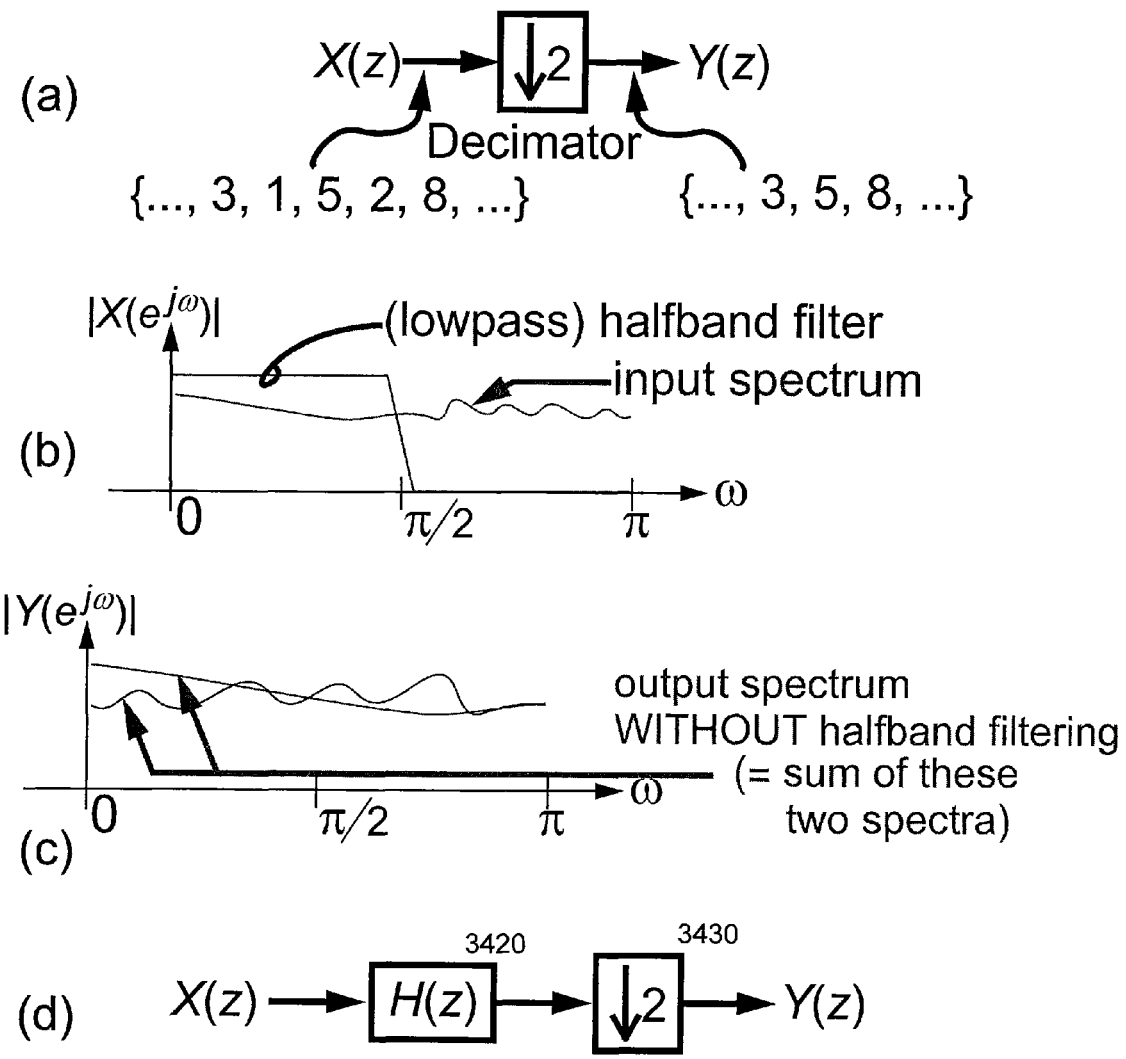
Fig. 34. Halfband filter and decimator. (a) Decimator operation (time domain).
(b) Input spectrum (red curve). (c) Decimator output (frequency domain).
(d) Halfband filter use with decimator to remove aliased (blue) spectrum.

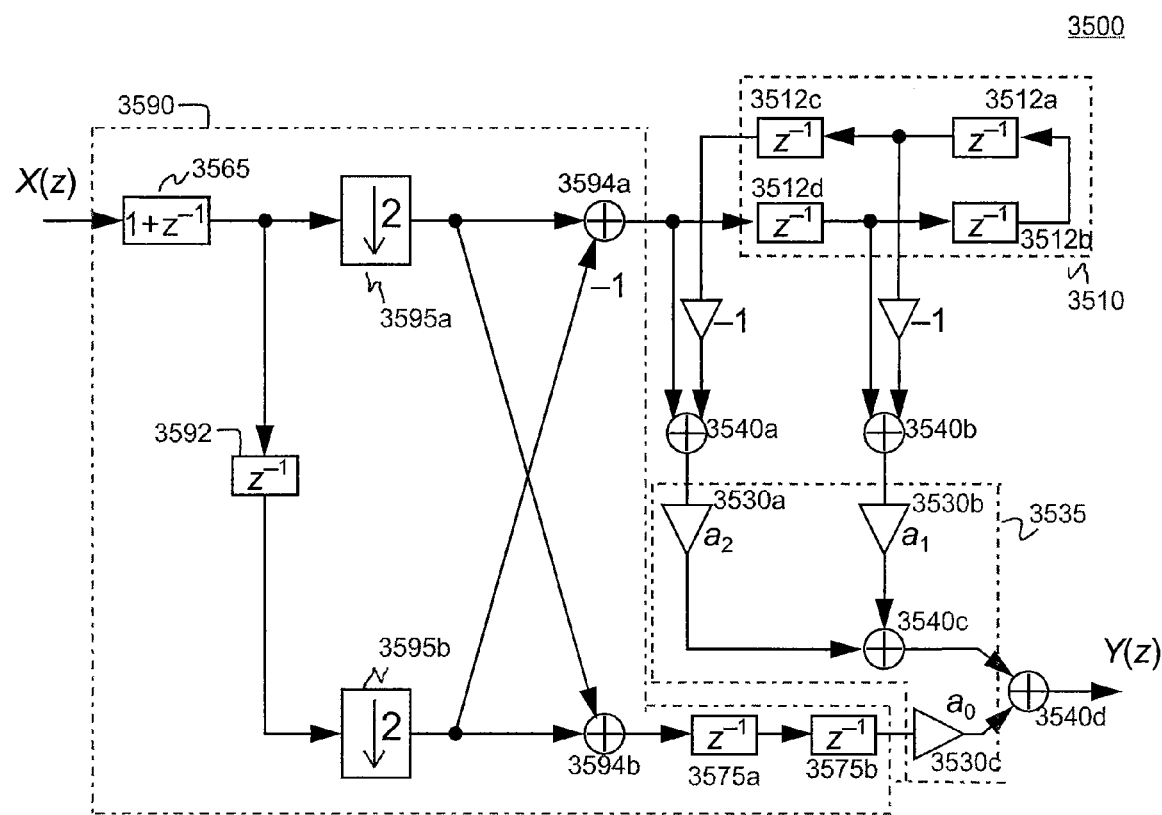
FIG. 35  Example of a desensitized 11-tap halfband filter implemented in combination with a decimator, as in Fig. D(d).

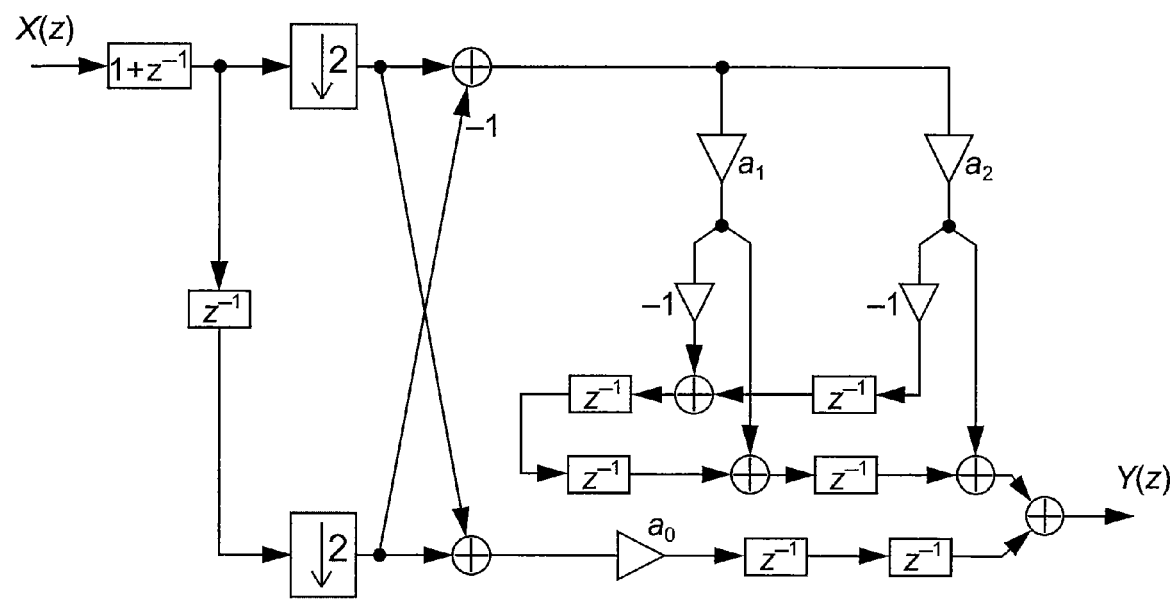
FIG. 36 Example of a desensitized 11-tap transposed-form halfband filter implemented in combination with a decimator, as in Fig. D(d).

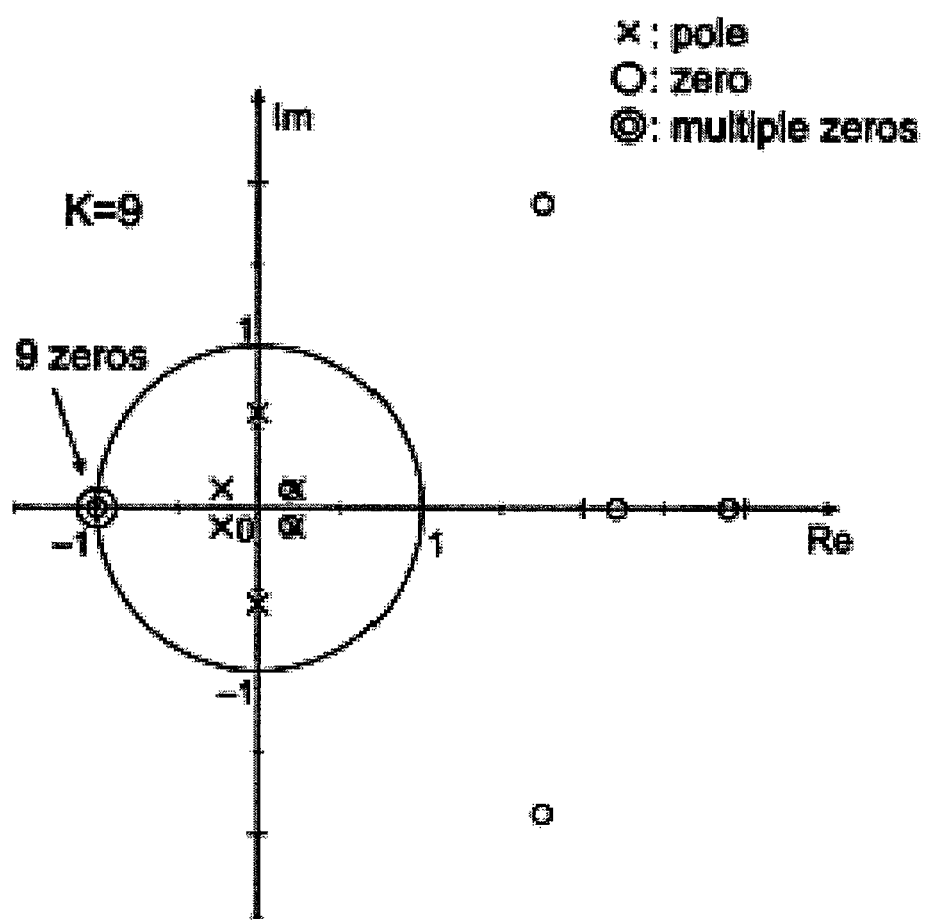
FIG. 37  Example of an IIR halfband filter.

DESENSITIZED FILTERS

CROSS-REFERENCE TO RELATED APPLICATIONS

This patent application claims the benefit of Provisional Patent Application No. 60/953,355, filed Aug. 1, 2007, entitled "Desensitized Halfband Filters," which is incorporated herein by reference in its entirety.

FIELD OF THE INVENTION

The invention relates generally to digital filters.

BACKGROUND

Finite impulse response (FIR) filters are commonly used digital filters. An FIR filter has an impulse response that settles to zero in a finite number of sample periods. FIR filters are inherently stable because FIR filters require no feedback and have their poles at the origin (within the unit circle of the complex z plane). However, all digital filters, including FIR filters, are sensitive to perturbations in the filter's tap coefficients.

A digital filter constructed as a cascade of two or more subfilters can possess the capability of lowering the filter's sensitivity to these filter coefficient perturbations. This property is described in J. W. Adams and A. N. Willson, Jr., "A new approach to FIR digital filters with fewer multipliers and reduced sensitivity," IEEE Trans. Circuits Syst., vol. CAS-30, pp. 277-283, May 1983 [referred to herein as "Adams"] which is herein incorporated by reference in its entirety.

In general, during the design of an FIR filter, the filter's length and tap coefficient's are selected to meet pre-defined characteristics that are usually specified in terms of the filter's frequency response $H(e^{j\omega})$. One goal of FIR filter design is to select filter taps and filter length that minimize stopband ripple and passband ripple for the filter's frequency response. (For a digital filter, the frequency response function is the filter's transfer function H(z), evaluated on the unit circle in the complex z-plane, i.e., $z=e^{j\omega}$.) The Remez algorithm is often used in FIR filter design to solve for the filter tap coefficients that produce the desired equal ripple passband and stopband behavior.

In Adams, an efficient digital FIR lowpass filter was implemented as a cascade of a multiplierless prefilter and an amplitude equalizer. Instead of building the conventional filter as dictated by the design technique used, a less costly implementation is utilized for the prefilter (e.g., all tap coefficients set to one with the first null occurring at the beginning of the stopband). The prefilter is not an optimal filter by itself. However, the cascaded amplitude equalizer fixes the imperfections of the rough pre-filter. The resulting efficient FIR lowpass filter meets the required design constraints for the FIR filter and has both a reduction in hardware implementation costs as well as improved sensitivity. Roughly speaking, the lowered sensitivity of the filter's frequency response to perturbations of the amplitude equalizer's coefficients results from the filtering action of the prefilter.

A common component in digital circuitry for communication systems is the halfband filter. Halfband filters are often used in cooperation with up-samplers and down-samplers in multirate systems when a sampling-rate change is required. Because of the requirements of a halfband filter, the type of prefilter used in Adams cannot implement a desensitized halfband filter.

What is therefore needed are new structures for implementing desensitized halfband interpolation filters.

BRIEF DESCRIPTION OF THE DRAWINGS/FIGURES

FIG. 1 depicts a frequency response of an exemplary halfband filter.

FIG. 2A depicts the passband detail and FIG. 2B depicts the stopband detail for the halfband filter of FIG. 1.

FIG. 3 depicts the coefficients of the smallest (shortest) halfband filter which occurs when N=1.

FIG. 4 depicts the coefficients of a halfband filter having length 7.

FIG. 5 depicts an exemplary structure for a direct implementation of the conventional halfband filter having length 7.

Figure 38:
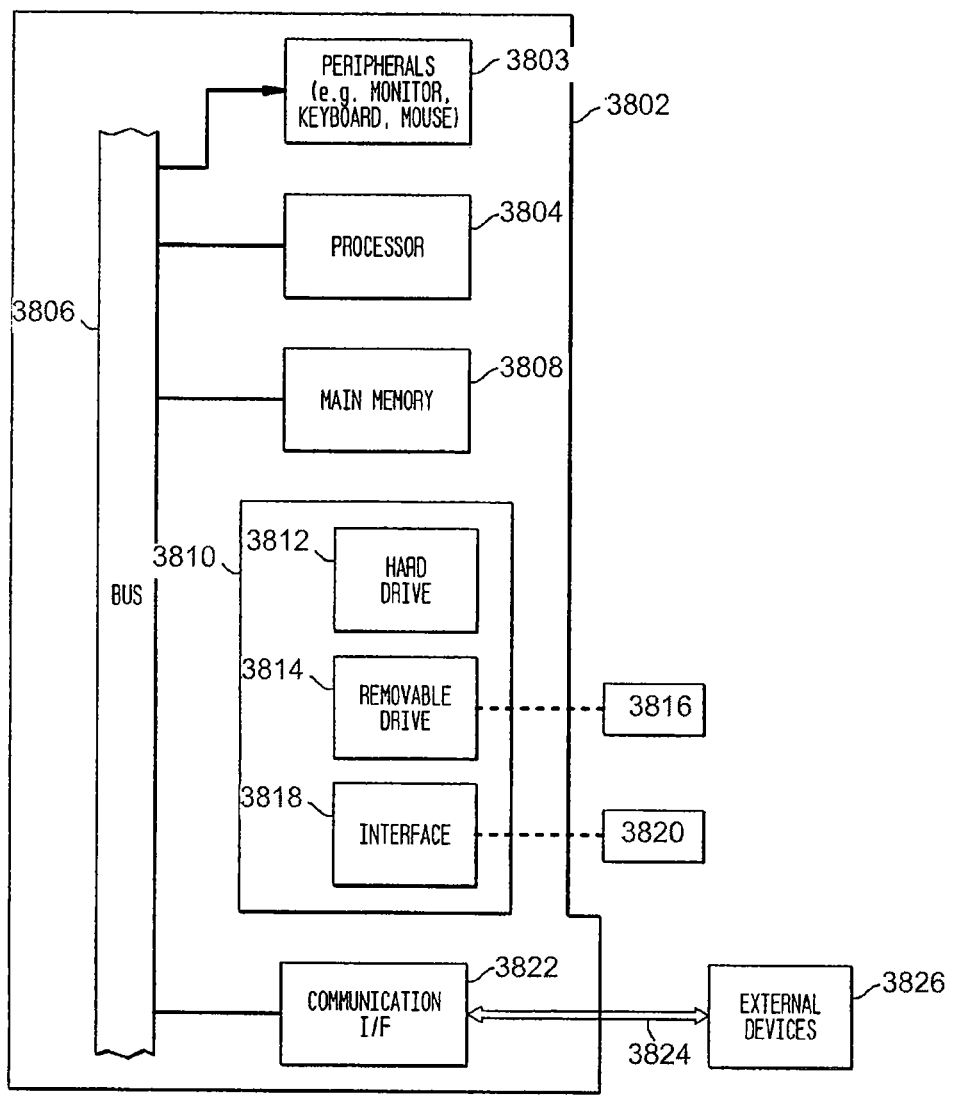

FIG. 6A depicts the mathematics associated with a conventional up-sampler (also referred to as a data-rate expander); FIG. 6B depicts an up-sampler operation; FIG. 6C depicts a halfband anti-imaging filter; and FIG. 6D illustrates the mathematical relations for an up-sampler system.

FIG. 7 illustrates the structure of a degree fourteen (15-tap) halfband anti-imaging filter with a data-rate expander having components of the filter moved prior to up-sampling component.

FIG. 8 depicts the structure of the degree fourteen halfband filter of FIG. 7 in transposed form.

FIG. 9 depicts a desensitized implementation of a 15-tap halfband anti-imaging filter along with a data-rate expander, according to embodiments of the present invention.

FIG. 10 depicts an alternative implementation of a desensitized 15-tap halfband filter, according to embodiments of the present invention.

FIG. 11 depicts the definition for a sample-and-hold upsampler.

FIG. 12 depicts an alternate implementation of a 15-tap desensitized halfband anti-imaging filter, using sample-and-hold up-samplers, according to embodiments of the present invention.

FIG. 13 depicts a transposed implementation of a desensitized 15-tap halfband filter, according to embodiments of the present invention.

FIG. 14 depicts the frequency response of an exemplary conventional 15-tap halfband filter.

FIG. 15 depicts the frequency response of an exemplary 15-tap halfband filter using 10-bit tap quantization.

FIG. 16 depicts sensitivity plots for a conventional 15-tap halfband filter and a desensitized 15-tap halfband filter, according to embodiments of the present invention.

FIG. 17 depicts an optimal implementation of an MCM tree for the conventional transposed-form 11-tap halfband filter structure.

FIG. 18 depicts the conventional transposed-form 11-tap halfband filter structure.

FIG. 19 depicts an optimal implementation of an MCM tree for the desensitized 11-tap halfband filter.

FIG. 20 depicts this desensitized transposed-form 11-tap halfband filter structure, according to embodiments of the invention.

FIG. 21 depicts an optimal implementation of an MCM tree for a conventional 19-tap halfband filter structure.

FIG. 22 depicts an optimal implementation of an MCM tree for a desensitized 19-tap halfband filter structure.

FIG. 23 depicts an optimal implementation of an MCM tree for a desensitized 55-tap halfband filter structure.

FIG. 24 illustrates the SPT terms of the coefficients for a conventional third halfband filter (THF).

FIG. 25 illustrates the SPT coefficients of Desensitized-47, according to embodiments of the present invention.

FIGS. 26A and B depict direct and transposed forms for exemplary FIR filters.

FIG. 27 depicts a graph of an array of B branch nodes and S sum nodes used in a proof.

FIG. 28 depicts a transpose of the MCM block of FIG. 19.

FIG. 29 depicts an implementation of a desensitized 11-tap halfband filter, according to embodiments of the present invention.

FIG. 30A depicts a desensitized version of an exemplary 11-tap halfband filter (F7 of Goodman), realized in transposed form, according to embodiments of the present invention.

FIG. 30B depicts a desensitized version of an exemplary 11-tap halfband filter (F7 of Goodman), realized in a direct form, according to embodiments of the present invention.

FIG. 30C depicts an interpolator using an exemplary 11-tap halfband filter (F7 of Goodman), desensitized and using fractional coefficients implemented as hard-wired rightward bit-shifts, according to embodiments of the present invention.

FIG. 31 depicts an alternate implementation of a desensitized 19-tap halfband filter, according to embodiments of the present invention.

FIG. 32 depicts the general alignment of the passband and stopband in a halfband filter.

FIG. 33 depicts the magnitude of the frequency response of a 3-tap halfband filter.

FIG. 34 shows the operation of a decimator that downsamples an input sequence by a factor of two by omitting every other input sample.

FIG. 35 depicts an exemplary desensitized 11-tap halfband filter implemented in combination with a decimator, according to embodiments of the present invention.

FIG. 36 depicts an exemplary desensitized 11-tap transposed-form halfband filter implemented in combination with a decimator, according to embodiments of the present invention.

FIG. 37 depicts a pole/zero plot of an exemplary IIR halfband filter.

FIG. 38 depicts an exemplary computer system, according to embodiments of the present invention.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following detailed description of the present invention refers to the accompanying drawings that illustrate exemplary embodiments consistent with this invention. References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment.

Further, when a particular feature, structure, or characteristic is described in connection with an embodiment, it is submitted that it is within the knowledge of one skilled in the art to affect such feature, structure, or characteristic in connection with other embodiments whether or not explicitly described.

Other embodiments are possible, and modifications may be made to the embodiments within the spirit and scope of the invention. Therefore, the detailed description is not meant to limit the invention. Rather, the scope of the invention is defined by the appended claims.

I. Overview

While techniques for designing digital filters are well known, an entirely new method for the design and implementation of halfband filters is presented here, one in which the filter's transfer function can be provided with a significant insensitivity to the filter's tap coefficient values. Such insensitivity can be exploited in the filter-design process to yield halfband filters with reduced hardware requirements, which can lead to circuits having lower power consumption, higher operating speeds, and smaller IC area.

As described above, because of the requirements of a halfband filter, the type of prefilter used in Adams cannot implement a desensitized halfband filter. Fortunately, however, a modification can be made to the type of prefilter that was employed in Adams and it can yield a suitable halfband prefilter. If we consider a cascade of two of the simplest prefilters from Adams, i.e., let $P(z)=(1+z^{-1})(1+z^{-1})$ then this $P(z)$ is a halfband filter. We have: $P(z)=1+2z^{-1}+1z^{-2}$. The resulting prefilter (with taps 1, 2, 1) can be implemented cheaply because no real multiplication is necessary. Multiplication by two (or any positive or negative integer power of two) can be implemented in binary with a shift operation. The design of desensitized halfband filters is described in further detail in Section II, below.

Halfband Filters

A common component in digital circuitry for communication systems is the halfband filter. This section provides a brief review of halfband filter characteristics and requirements. An FIR halfband filter is an FIR digital filter whose transfer function is of the form $$H(z) = z^{-N}\left(h_0 + \sum_{k=1,3,\ldots}^{N} h_k(z^k + z^{-k})\right). \tag{1}$$

Thus, an FIR halfband filter is a symmetric (hence, linear phase) FIR filter of length 2N+1, for some odd integer N, for which all coefficients $h_k$, where k is an even integer, have the value zero, except for the coefficient in the center $h_0$ which is nonzero. Typically, $h_0$ has the value ½, and the other nonzero $h_k$ coefficients can have any desired values.

Since the factor $z^{-N}$ in equation (1) satisfies $|z^{-N}|=1$ for all z on the unit circle of the complex z plane, the design of a halfband filter is often carried out using the real-valued (albeit physically unrealizable, so called zero phase) transfer function $$H_0(z) = h_0 + \sum_{k=1,3,\ldots}^{N} h_k(z^k + z^{-k}) \tag{2}$$

which can be written as $$H_0(e^{j\omega}) = h_0 + \sum_{k=1,3,...}^{N} 2h_k \cos k\omega \qquad (3)$$

for all unit-magnitude complex values z, i.e., for $z=e^{j\omega}$. FIR filters are, in fact, usually designed by working with a zero-phase function of the equation (3) type, and the factor $z^{-N}$ of equation (1) is then included to create the physically realizable transfer function H(z), for which $|H(e^{j\omega})|=|H_0(e^{j\omega})|$.

The halfband filter constraints on the $h_k$ having even k (i.e., $h_k=0$ for all even $k \neq 0$) provide all halfband filters with the general feature that the real-valued zero-phase part of the halfband filter satisfies $H_0(e^{j\pi/2})=\frac{1}{2}$ and, furthermore, the function $H_0(e^{j\omega})$ possesses odd symmetry about this $\omega=\pi/2$ value. That is, we have $$H_0(e^{j(-\omega+\pi/2)})+H_0(e^{j(\omega+\pi/2)})=1, \text{ for all } \omega \in [0,\pi/2]. \qquad (4)$$

Typically, the halfband filter's nonzero coefficients are chosen such that the relation $H_0(e^{j\omega}) \approx 1$ holds in the passband (i.e., it holds for low frequencies within the interval $\omega \in [0, \pi/2]$) and the odd-symmetry relation (4) then causes $H_0(e^{j\omega}) \approx 0$ in the stopband (i.e., it holds for high frequencies within the interval $\omega \in [\pi/2, \pi]$). FIG. 32 depicts the general alignment of the passband and stopband in a halfband filter.

FIG. 1 depicts the magnitude of the frequency response 100 of an exemplary halfband filter, illustrating the general features described above. As depicted in FIG. 1, the transfer function $H(e^{j\omega})$ 102 is approximately 1 in passband 110 and is approximately 0 in stopband 120. Additionally, as shown in FIG. 1, the function $H(e^{j\omega})$ possesses odd symmetry about the point $\omega = \pi/2$. FIG. 2A depicts the passband detail and FIG. 2B depicts the stopband detail for the halfband filter of FIG. 1.

As depicted in FIGS. 2A and 2B, one consequence of the odd-symmetry of $H_0(e^{j\omega})$ about $\omega=\pi/2$ is that the passband ripples 212 of $H_0(e^{j\omega})$ are exactly the same as a 180-degree rotated (upside-down) version of the stopband ripples 222. Also, since $\cos k\omega \approx 1$ for all $\omega$ sufficiently near $\omega=0$, it follows from equation (3) that the coefficient values of a well-designed halfband filter will tend to satisfy $h_0+2(h_1+h_3+...) \approx 1$. In fact, if $H_0(e^{j0})=1$ then $$h_0+2(h_1+h_3+...)=1 \qquad (5)$$

and this situation will also be accompanied by $H_0(e^{j\pi})=0$ due to the odd-symmetry of $H_0(e^{j\omega})$ discussed above.

A halfband filter may also be scaled by an arbitrary value P (as illustrated in FIG. 1) and this scaling will cause the passband level to be at the value P, not 1. Such scaling is of course accomplished by multiplying all $h_k$ coefficient values by P. In this case, the relation (5) can be written as $$h_0=2(h_1+h_3+...) \qquad (6)$$

wherein the scaling value P need not appear explicitly, and this more general constraint of course accommodates the unscaled relation (5) for which $h_0=\frac{1}{2}$.

FIG. 3 depicts the coefficients of the smallest (shortest) halfband filter which occurs when N=1. Therefore, equation (1) implies a three-tap filter having the transfer function:

$$H(z)=z^{-1}(h_1 z^1+h_0+h_1 z^{-1})$$

This case accommodates the above-mentioned halfband prefilter which, after scaling P(z) by ¼, becomes $$P(z) = \frac{1}{4} + \frac{1}{2}z^{-1} + \frac{1}{4}z^{-2}.$$

Here, it will follow that $H_0(e^{j\omega})=\frac{1}{2}+\frac{1}{2}\cos \omega$ (i.e., we set $h_0=\frac{1}{2}$ and $h_1=\frac{1}{4}$). FIG. 33 depicts the magnitude of the frequency response for this 3-tap filter.

Direct Implementation

According to equation (1), the second-smallest halfband filter will have length 7, and will correspond to the N=3 case:

$$H(z)=z^{-3}(h_3 z^3+h_1 z^1+h_0+h_1 z^{-1}+h_3 z^{-3})$$

This filter will be described by tap coefficients $h_0$, $h_1$ and $h_3$, as illustrated in FIG. 4.

FIG. 5 depicts an exemplary structure 500 for a direct implementation of the conventional 7-tap halfband filter of FIG. 4. In structure 500, the input samples are delayed by three two unit delays 510a-c and by a single one unit delay 510d. The samples are further processed by a series of adders 540a-d and a series of multipliers 530a-c. An adder may be any one of a number of known types of adders, e.g., a carry-ripple adder, a carry-save adder, etc. As will be understood to one of ordinary skill in the art, the number of adders employed may vary when different kinds of adders are used. Unless otherwise indicated to the contrary, the number of adders mentioned at various points herein is understood to refer to the number of carry-ripple adders.

The multipliers 530a-c are commonly referred to as "taps" and the coefficients of the multipliers ($h_0$, $h_1$ and $h_3$) are referred to as the "tap coefficients." The structure of FIG. 5 takes advantage of the symmetric character of the tap coefficients, around the center tap $h_0$ (as is conventionally done for most linear phase filter implementations), to reduce the required number of multipliers, in this case to three.

In FIG. 5, adder 540a receives a present input sample and an input sample that has been delayed by $z^{-6}$. The output of adder 540a is multiplied by the coefficient, $h_3$, of multiplier 530c. Similarly, adder 540b receives an input sample delayed by $z^{-2}$ and an input sample that has been delayed by $z^{-4}$. The output of adder 540b is multiplied by the coefficient, $h_1$, of multiplier 530b. Finally, multiplier 530a receives an input sample delayed by $z^{-3}$. The outputs of multipliers 530a, b, and c are combined by adders 540c and 540d.

Halfband filters are often used in cooperation with up-samplers and down-samplers in multirate systems when a sampling-rate change is required. FIG. 6A depicts the mathematics associated with a conventional up-sampler (also referred to as a data-rate expander). In the up-sampler depicted in FIG. 6A, the data rate is being expanded by 2, resulting in an output, $Y(z)=X(z^2)$. As illustrated in FIG. 6B, performing up-sampling by 2 requires the data-rate expander produce 2 samples for every one input sample. The conventional way of up-sampling by 2, shown in FIG. 6B, produces a zero following every input sample.

One consequence of an up-sampling operation is the appearance of images of lower frequencies at higher frequencies in the up-sampled signal's spectrum. As depicted in FIG. 6C, the up-sampled signal has a spectrum 602 whose magnitude is mirror imaged about the point $\omega=\pi/2$. In a multirate system where the sample rate is being doubled, a halfband filter is employed to eliminate these images of lower frequencies that appear at higher frequencies in the up-sampled signal's spectrum.

FIG. 6D depicts the mathematical relations for an up-sampler system 600D. Up-sampler system 600D includes a data-rate expander (up-sampler) 610 and a filter 620. In embodiments, filter 620 is a lowpass halfband filter. The use of a lowpass halfband filter in an up-sampling environment is illustrated in FIG. 6C. The up-sampled signal 602 ($X(z^2)$) is run through a lowpass halfband filter 620, filtering out the unwanted images (denoted as the hashed signal portion 604).

A consequence of implementing a filter after an up-sampling operation is that the digital circuitry of the filter must operate at a higher data rate then if the circuitry is built prior to the up-sampling operation (e.g., at least twice the rate, for an up-sampling by 2 operation). Therefore, it is preferable to move components of the digital filter in front of the up-sampling operation. While it is evident that the up-sampling occurs before the filtering for such anti-imaging filters, it is possible to move some components of the filter back through the up-sampler so that they operate at the lower frequency.

Therefore, the designer wants the up-sampling component located more forward so as to cause as much as possible of the filter hardware to operate at the lower sample rate. FIG. 7 illustrates the structure of a degree-fourteen (15-tap) halfband anti-imaging filter with data-rate expander 700 having components of the filter moved prior to the up-sampling component. Structure 700 includes a delay chain 710 having a series of one-unit delays ($z^{-1}$) 712a-g, a set of multipliers (taps) 730a-e having tap coefficients ($h_0, h_1, h_3, h_5$, and $h_7$), and a set of adders 740a-g, each prior to the up-sampling components 780a, b. Structure 700 further includes a one unit delay ($z^{-1}$) 715 and an adder 745 following the up-sampling components 780a, b.

Notice that the $z^{-2}$ elements that would have appeared near the top of FIG. 7 have become $z^{-1}$ elements as they now appear within the lower-sample-rate part of the system. Notice also that the up-sampler has had to bifurcate, becoming two up-samplers 780a, b, one on each side of the single $z^{-1}$ element (which has been interchanged with the $h_0$ multiplier of FIG. 5, so that the $h_0$ multiplication can be performed at the lower sample rate).

As described above, when an up-sampling by 2 operation is performed, a zero is produced after every input sample. Therefore, in filter 700, up-sampler 780a is putting out a signal having zeros every other sample. Up-sampler 780b is also putting out a signal having zeros every other sample. Because the output of up-sampler 780a is delayed by one, the zeros produced by up-sampler 780a are not occurring at the same time as the zeros produced by up-sampler 780b when both data streams arrive at adder 745. Because a zero is always being added to a non-zero signal, the adder operation 745 can be replaced by an interleaving operation. Consequently, the elements included in block 790 of FIG. 7 could be replaced by a multiplexer.

Transposed Configurations

An FIR filter may also be implemented in an alternate transpose configuration. It is convenient to obtain the transposed-form filter from a direct-form filter by reversing all signal-flow directions. FIG. 8 depicts the structure 800 of the degree-fourteen halfband filter with data-rate expander of FIG. 7 in transposed form. Structure 800 can be considered as including two blocks, an F(z) block 860 and a G(z) block 870. F(z) block 860 includes a series of one unit delays 812a-g in a delay loop 810. The branch nodes in the delay loop 710 of FIG. 7 have been replaced by summation nodes 814a-g in delay loop 810 of FIG. 8. F(z) block 860 also includes a subset of multipliers (taps) 830b-e, having tap coefficients ($h_1, h_3, h_5$, and $h_7$). G(z) block 870 includes the remaining multiplier (tap) 830a having tap coefficient ($h_0$) and three one-unit delays 875a-c.

Notice that the transposed-form filter of FIG. 8 has all multipliers 830a-e simultaneously operating on the same input sample, unlike the direct-form filter of FIG. 7. Because multipliers 830a-e operate on the same input sample, techniques can be used to simplify the structure of the five multipliers in FIG. 8. This can result in a reduction in the cost of implementation of the filter. However, notice also that extra delays 875a-c (not present in the direct-form filter) are required in the G(z) block shown in FIG. 8, where the presence of the two up-samplers dictates a separate path for the $h_0$ multiplier's output.

II. Desensitized Halfband Filter

Factoring Out a Prefilter

As described above, the transfer function of any halfband filter is going to have a polynomial of a special structure having zeros for every other tap except for the center tap. To implement a desensitized halfband filter as a prefilter-equalizer cascade, it is necessary that the transfer function of the overall halfband filter have the transfer function of the prefilter as a factor. In embodiments, the second-order prefilter P(z) mentioned above ($P(z)=(1+z^{-1})(1+z^{-1})$) can be used. This section describes the necessary constraints on a halfband filter in order for its transfer function to possess the factor $(1+z^{-1})$.

This requirement is simply the requirement that the polynomial in $z^{-1}$ that defines the halfband transfer function H(z) possess a zero at $z=-1$, i.e., at $\omega=\pi$. Viewed this way, the requirement becomes simply that $H(e^{j\omega})=0$. It therefore follows, from the above discussion, that the set of desensitized halfband filters must be restricted to the set whose coefficients obey equation (6). Equivalently, again using the above insights, our desensitized halfband filters must satisfy $H(e^{j0})=1$. These limitations are reasonably mild, in that any well-designed halfband filter will possess coefficients that approximately satisfy equation (6), as discussed previously.

Having limited the halfband filters to ones whose transfer function possesses the factor $(1+z^-)$ it will then happen—automatically—that the halfband filter will also have a second $(1+z^{-1})$ factor. An easy proof of this fact is to simply recall that the transfer function $H(e^{j\omega})$ is periodic of period $2\pi$ and also that the halfband filter's zero-phase function (3) is symmetric about the point $\omega=\pi$. This means, of course, that $H_0(e^{j\pi})=0$ can only occur if the derivative of $H_0$ is also zero at $\omega=\pi$. That is, a double zero is necessarily present at $\omega=\pi$ whenever one zero exists at $\omega=\pi$.

Accordingly, the above proves that the transfer function of an FIR halfband filter will possess the factor $P(z)=(1+z^{-1})(1+z^{-1})$ if and only if any of these three equivalent conditions holds:

$$|H(e^{j\omega})|=0 \text{ at } \omega=\pi \qquad \text{i)}$$

$$|H(e^{j\omega})|=1 \text{ at } \omega=0 \qquad \text{ii)}$$

$$h_0=2(h_1+h_3+\ldots). \qquad \text{iii)}$$

[collectively referred to herein as "Theorem"]

One more insight, regarding Condition iii) of this Theorem is worth mentioning: It is well known that, in a system such as depicted in FIG. 7, the part at the output side serves simply to interleave the two streams of samples that enter the two up-samplers. When such a system processes a nonzero DC signal—say $x(n)=d\neq0$ for all n—then one up-sampler is being fed with the DC signal $x_1(n)=h_0 \times d$ for all n, while the other is being fed the DC signal $x_2(n)=2(h_1+h_3+\ldots)\times d$ for all n. Hence, unless the conditions of the above Theorem hold, the system's output will not be simply a DC output; it will contain an oscillation at the system output's Nyquist frequency whose amplitude will be proportional to the amount by which the values $h_0$ and $2(h_1+h_3+\ldots)$ differ. Moreover, such an error will also be present when the system is processing any input signal having a nonzero DC component. For this reason, it is apparent that Condition iii), i.e., the condition expressed in equation (6), is not only a mild constraint on a halfband filter's transfer function, it is likely a very desirable constraint in an up-sampling environment.

Assuming now that the halfband filter's transfer function possesses the factor $(1+z^{-1})$, it can be factored out of the transfer function $H(z)$. For the degree-fourteen transfer function of the FIG. 7 system, for example:

$$H(z) = (1+z^{-1})[h_7 + (-h_7)z^{-1} + (h_7+h_5)z^{-2} + (-h_7-h_5)z^{-3} +$$
$$(h_7+h_5+h_3)z^{-4} + (-h_7-h_5-h_3)z^{-5} + (h_7+h_5+h_3+h_1)z^{-6} +$$
$$(h_7+h_5+h_3+h_1)z^{-7} + (-h_7-h_5-h_3)z^{-8} + (h_7+h_5+h_3)z^{-9} +$$
$$(-h_7-h_5)z^{-10} + (h_7+h_5)z^{-11} + (-h_7)z^{12} + h_7 z^{-13}]$$

which can be rewritten as $$H(z) = (1+z^{-1})\{[a_0 z^{-6} + a_1(z^{-4}-z^{-8}) + a_2(z^{-2}-z^{-10}) + a_3(1-z^{-12})] + z^{-1}[a_0 z^{-6} - a_1(z^{-4}-z^{-8}) - a_2(z^{-2}-z^{-10}) - a_3(1-z^{-12})]\} \quad (7)$$

where $a_0 = h_1 + h_3 + h_5 + h_7$ $a_1 = h_3 + h_5 + h_7$ $a_2 = h_5 + h_7$ $a_3 = h_7$. (8)

Notice that the halfband filter's center-tap value $h_0$ is not explicitly used in the definition of the $a_k$ values—its value being understood as redundant information, in that equation (6) is assumed to hold.

Using the factorization of equation (7), it is possible to create an implementation of the halfband filter of FIG. 7 in the "desensitized" manner. FIG. 9 depicts a desensitized implementation 900 of a 15-tap halfband anti-imaging filter along with a data-rate expander, according to embodiments of the present invention. Although implementation 900 includes a data-rate expander, as would be immediately appreciated by persons of skill in the art, and described further below, the desensitized halfband filter may be used alone, in an up-sampling environment with a data-rate expander or in a down-sampling environment with a decimator.

Desensitized structure 900 includes a delay chain 910 having a series of six one-unit delays ($z^{-1}$) 912a-f, a set of multipliers (taps) 935a-d having coefficients ($a_0$, $a_1$, $a_2$, and $a_3$), and a set of adders 940a-g prior to the up-sampling components 980a, b (i.e., in the lower sample-rate section). Structure 900 further includes a one unit delay ($z^{-1}$) 915 and an adder 945 following the up-sampling components 980a, b. The output of adder 945 is fed into the $(1+z^{-1})$ block 960.

Adder 940d receives the present input sample and an input sample delayed by $z^{-6}$ (after multiplication by −1). The output of adder 940d is multiplied by coefficient $a_3$ by multiplier 935d. Adder 940c receives an input sample delayed by $z^{-1}$ and an input sample delayed by $z^{-5}$ (after multiplication by −1). The output of adder 940c is multiplied by coefficient $a_2$ by multiplier 935c. Adder 940b receives an input sample delayed by $z^{-2}$ and an input sample delayed by $z^{-4}$ (after multiplication by −1). The output of adder 940b is multiplied by coefficient $a_1$ by multiplier 935b. Multiplier 935a receives an input sample delayed by $z^{-3}$ and multiplies the input value by the coefficient $a_0$. As will be appreciated by one of ordinary skill in the art, the −1 multiplications can be omitted by the use of subtractors in place of the adders: 940d, 940c, and 940b.

The outputs of multipliers 935b, c, and d are combined and added to the output of multiplier 935a in adder 940g and subtracted from the output of multiplier 935a in adder 940a. The output of adder 940a is fed as input into up-sampler 980a and the output of adder 940g is fed as input into up-sampler 980b.

The structure of FIG. 9 bears some similarities to the conventional halfband structure depicted in FIG. 7. Both structures require two up-samplers (780a, b in FIGS. 7 and 980a, b in FIG. 9) and both involve one $z^{-1}$ delay element (715, 915) and one adder (745, 945) following the up-samplers to interleave the two up-sampled sequences. Both systems require the same number of adders (seven) on the low-data-rate side, although many of them have effectively become subtractors in the new system of FIG. 9. The system of FIG. 9, however, requires an additional delay element and an adder to finish the processing with the $(1+z^{-1})$ block at the system's output. This extra cost is likely offset by the savings that occur elsewhere in the new structure of FIG. 9. At the block-diagram level, for example, while the conventional structure requires five scaling multipliers 730a-e (having the coefficient values $h_0$, $h_1$, $h_3$, $h_5$, $h_7$) the new structure requires only four scaling multipliers 935a-d (having the coefficient values $a_0$, $a_1$, $a_2$, $a_3$). Also, one fewer $z^{-1}$ delay element is required on the low-data-rate side of the system of FIG. 9 (seven delays appear in the conventional system of FIG. 7, while the new system of FIG. 9 requires just six).

Although the above section derived the desensitized structure for a 15-tap halfband filter, its realization and its mathematical description are simple enough that a similar design procedure for halfband filters of other lengths would be appreciated by persons of skill in the art.

Alternate Forms for the Desensitized Halfband Filter

Just as the conventional halfband filter can be implemented in a transposed form, it may be useful to find a transposed-form implementation of the desensitized halfband filter. To accommodate the presence of an up-sampler in the system, as noted above, the transposed-form of a conventional halfband filter needs a few extra delay elements that are not present in the direct-form filter (i.e., the three $z^{-1}$ blocks at the bottom of FIG. 8). The transposed-form desensitized structure will also have this property. As a step in the direction of obtaining the transposed-form desensitized halfband, an alternate direct-form structure can be created, one that possesses the extra $z^{-1}$ blocks.

The right side of (7) can easily be rearranged such that the part inside the curly brackets is written as a sum of terms that each have just a single $a_k$ factor, yielding:

$$H(z) = (1+z^{-1})\{a_0 z^{-6}(1+z^{-1}) + a_1 z^{-4}(1-z^{-4})(1-z^{-1}) +$$
$$a_2 z^{-2}(1-z^{-8})(1-z^{-1}) + a_3(1-z^{-12})(1-z^{-1})\}.$$

This form of $H(z)$ easily leads to the implementation shown in FIG. 10.

FIG. 10 depicts an alternative implementation 1000 of a desensitized 15-tap halfband filter, according to embodiments of the present invention. The implementation of FIG. 10 shares certain substructures with that of FIG. 9. However, unlike the structure of FIG. 9, FIG. 10 does not include any rate-changing operations. That is, it has not had any part of it moved through an up-sampler or down-sampler—hence it possesses $z^{-2}$ delay blocks 1012a-f instead of the $z^{-1}$ blocks 912a-f of FIG. 9. Alternative implementation 1000 also includes a block 1090 including a one unit delay 1092, two adders 1094 a, b, and three two unit delays 1095a, b, and c. Since the structure of FIG. 10 has parallel paths that all converge on the output path, each ending in an $a_k$ multiplier, it has an ideal form for converting into an efficient transposed configuration.

In block 1090, adder 1094a subtracts an input sample delayed by $z^{-1}$ from the present input sample to produce $X(z)(1-z^{-1})$ which is fed as an input into the delay block 1010 and as input into adder 1040d. Adder 1094b adds an input sample delayed by $z^{-1}$ to the present input sample to produce $X(z)(1+z^{-1})$ which is fed through the three delays 1095a, b, and c.

One additional modification may be useful in desensitized systems. It concerns the "pushing back" of the system output's $(1+z^{-1})$ block (e.g., block 960 in FIG. 9) to the point where it can be combined with up-samplers. For this purpose, the symbol shown in FIG. 11 for a "sample-and-hold up-sampler" is defined. Such an up-sampler simply outputs two consecutive sample values, each equal to the latest input value received, rather than outputting the input value followed by a zero, as in a conventional up-sampler—i.e., FIG. 6B. While this component eliminates the need for a separate $z^{-1}$ delay element at the high-data-rate side of the system, it creates a structure wherein one adder at the high output sample rate is still required. That is, while the interleaving operation employed in the conventional FIG. 7 system does not require that an actual addition be performed by the adder at the output node (in effect, such an addition would add two values, one of which is always zero), the sample-and-hold up-samplers of the new system insert no zero values between input samples.

FIG. 12 depicts an alternate implementation of a 15-tap desensitized halfband anti-imaging filter, using sample-and-hold up-samplers, according to embodiments of the present invention. In FIG. 12, the $(1+z^{-1})$ block 960 of FIG. 9 has been pushed back and combined with up-samplers 980a and 980b creating sample-and-hold up-samplers 1285a, b. Because these sample-and-hold up-samplers insert no zero values between input samples, the addition appearing at the output in the redrawn FIG. 12 version of FIG. 9 must actually perform as an adder. Thus, what gets eliminated by use of the sample-and-hold up-sampler is simply the interleaving operation (i.e., one multiplexer).

FIG. 13 depicts a transposed implementation 1300 of a desensitized 15-tap halfband filter with data-rate expander, according to embodiments of the present invention. FIG. 13 shows the result of reversing all signal flows in the FIG. 10 direct-form filter, thereby creating the transposed-form desensitized halfband filter structure. Transposed implementation 1300 includes a series of six one unit delays 1312a-f in a loop 1310, a set of four multipliers (taps) 1330a-d, having tap coefficients ($a_0$, $a_1$, $a_2$, and $a_3$), a series of adders 1314a-e in loop 1310, and three one-unit delays 1375a-c following multiplier 1330a. The transposed implementation also includes two adders 1342a, b, two sample-and-hold up-samplers 1385a, b, a one unit delay 1315, and an adder 1345 which receives as input the output of sample-and-hold up-sampler 1385a and the output delay 1315.

In FIG. 13, much of the transposed filter has been moved back through a preceding up-sampler, resulting in many $z^{-2}$ delay blocks becoming $z^{-1}$ blocks. The above-mentioned sample-and-hold up-samplers have also been employed in this filter. It can be compared with the conventional 15-tap transposed-form halfband filter of FIG. 8.

Whether or not there is an appreciable hardware savings at the block diagram level of the desensitized structures (FIGS. 12 and 13 vs. FIGS. 7 and 8) the true value of the new architecture resides in the lowered sensitivity of the filter's transfer function to variations in the tap-coefficient values of the multipliers. Such lowered sensitivity can be exploited to reduce the cost of implementing these multipliers.

To demonstrate the lowered sensitivity, the operation of a commercially available conventional filter is compared to the operation of the desensitized 15-tap halfband filter of FIG. 12. The selected conventional filter is a 15-tap halfband filter employed in a commercial product by Analog Devices (hereinafter the "AD filter"), using the tap coefficients (normalized to integer values): $h_0$=8192, $h_1$=4964, $h_3$=±1102, $h_5$=273, $h_7$=±39. As discussed in A. N. Willson, Jr., "Desensitized halfband interpolation filters" in *Proc. Midwest Symp. Circuits Syst.*, Montreal, August 2007, pp. 1034-1037 [Willson] which is incorporated herein by reference in its entirety, the AD filter does satisfy the $h_0$=2($h_1$+$h_3$+ . . . ) equation (6) constraint above.

When the coefficients of the AD filter, re-normalized such that $h_0$=0.5, are rounded to 13 fractional bits, the halfband filter has the transfer function whose magnitude plot is shown in FIG. 14. This plot is indistinguishable from a plot of the ideal transfer function (i.e., one using double-precision floating-point coefficients and computations). Because circuitry using floating point numbers would usually be too expensive, fixed-point numbers are preferred; these fixed-point coefficients must be quantized to a finite number of bits. One common design goal is to reduce the number of bits in the coefficients while still meeting the filter specifications.

An identical plot to FIG. 14 is also obtained when the filter is implemented as a desensitized halfband filter of the FIG. 12 type, where its multiplier coefficients $a_0$, $a_1$, $a_2$, $a_3$ have been obtained from the $h_k$ coefficients via equations (8) and then quantized to just ten fractional bits (as opposed to 13 fractional bits in the conventional structure). By way of comparison, if the conventional structure's coefficients are rounded to ten bits, a significant deterioration (almost 20 dB) of the halfband filter's stopband (shown in FIG. 15) results. Clearly, therefore, the desensitized structure could be used to achieve a [1(4/5)(10/13)]×100>38% reduction in coefficient storage requirements for this filter (where the 4/5 factor includes the fact that the desensitized structure needs just four coefficients, and the 10/13 factor relates to the shortened coefficient word length).

Another perspective on this situation can be obtained by computing the sensitivities of the transfer function to the coefficient values. Due to the relatively large variations in transfer function magnitude across the stopband, we use the normalized sensitivity function:

$$S_p^H = \frac{\partial(\ln H)}{\partial(\ln p)} = \frac{\Delta H}{H} \times \frac{\Delta p}{p}.$$

Using such a (frequency dependent) measure of transfer function sensitivity, the curves shown in FIG. 16 are obtained, each of which illustrates the sensitivity of the conventional structure or that of the desensitized structure with respect to one of its coefficients (p).

The top chart of FIG. 16 depicts the magnitude of the transfer function of a conventional 15-tap halfband filter in the stopband. The middle chart of FIG. 16 plots the sensitivities of the 5 coefficients of the nonzero taps, $h_0$, $h_1$, $h_3$, $h_5$, and $h_7$, of the conventional structure. As shown in FIG. 16, the coefficients (specifically $h_0$ and $h_1$) are in the high range of the chart between the nulls, and between the second and third nulls the sensitivities of $h_0$ and $h_1$ are off the middle chart. The bottom chart in FIG. 16 plots the coefficient sensitivities for the desensitized structure. Notice that, at the frequencies where the transfer function has a zero, all sensitivities are very large. Notice, however, that the sensitivities for the desensitized structure are generally significantly lower than those of the conventional structure at the frequencies lying between the transfer-function zeros.

Signed-Power-of-Two Halfband Filters

The desensitized structures described above can also be used to obtain realizations of halfband filters that require less hardware than the conventional halfband structures require. To do this, the focus is moved to a deeper level, below the block-diagram level considered above, closer to the physical structure that will be built. The actual construction of the multipliers is considered and the lowered sensitivity of new desensitized structures is exploited to achieve savings in the building of these multipliers.

Much work has been reported in the literature on the efficient implementation of tap-coefficient multipliers in digital filters, and in similar systems. For additional information on efficient implementation of tap-coefficient multipliers in digital filters, see A. G. Dempster and M. D. Macleod, "Use of minimum-adder multiplier blocks in FIR digital filters," *IEEE Trans. Circuits Syst.-II*, vol. 42, pp. 569-577, September 1995 [Dempster], O. Gustafsson, "A difference based adder graph heuristic for multiple constant multiplication problems," in *Proc. IEEE Int. Symp. Circuits Syst.*, New Orleans, May 2007, pp. 1097-1100 [Gustafsson I], and O. Gustafsson, "Lower bounds for constant multiplication problems," *IEEE Trans. Circuits Syst.-II*, vol. 54, pp. 974-978, November 2007 [Gustafsson II], each of which is incorporated by reference in its entirety.

It has been shown that a "multiplier block" can be created, a structure wherein an input value X is multiplied by a set of fixed integer coefficients also referred to as a "multiple constant multiplication" (MCM) block—and, by sharing some internal computations, very efficient realizations of these simultaneous multiplications can be obtained. Indeed, Gustafsson I and II have demonstrated the capability of obtaining optimal (e.g., minimal adder) implementations. In applying this work to the sensitivity problem described herein, an important insight is developed that when systems are made less sensitive to their system parameter values, then this insensitivity can be exploited to permit an implementation whose computations with these parameters can require fewer adders.

This section describes these signed power of two (SPT) desensitized filters. First, the implementation of a version of a small halfband filter using the conventional halfband architecture is described. Next, the implementation of a small halfband filter using the desensitized structure is described and the results of both implementations are compared. This section uses two examples taken from a classic halfband-filter paper by D. J. Goodman, "Nine digital filters for decimation and interpolation," *IEEE Trans. Acoust., Speech, Signal Processing*, vol. ASSP-25, pp. 121-126, April 1977 [Goodman], which is incorporated herein by reference in its entirety.

FIG. 18 depicts a conventional transposed-form 11-tap halfband filter structure with data-rate expander 1800. Filter structure 1800 includes a delay loop 1810 having five one unit delays 1812*a-e* and five adders 1814*a-d*. Structure 1800 also includes four multipliers 1830*a-d* (which can be considered a "multiplier block" for ease of discussion), two up-samplers 1880*a, b*, an adder 1845 and a one-unit delay 1815 coupled between adder 1845 and up-sampler 1880*b*. Because filter structure 1800 is in transposed form, the G(z) block 1870 includes multiplier 1830*a* and two one-unit delays 1875*a, b*.

Consider this 11-tap halfband filter (Goodman's F7 filter) having taps $\{h_5\ 0\ h_3\ 0\ h_1\ h_0\ h_1\ 0\ h_3\ 0\ h_5\}$ where $$h_0=512,\ h_1=302,\ h_3=-53,\ h_5=7.$$

It is possible to implement this filter as a conventional transposed-form halfband filter, using a total of just four adders, along with hardwired bit-shifts, to get the necessary products of each $h_k$ coefficient times an input sample value X, as shown in FIG. 17. This implementation uses an algorithm due to Gustafsson I to obtain the optimal "multiplier block" implementation.

The complete 11-tap conventional halfband filter structure is shown in FIG. 18, where the output values for the multipliers $h_0\ h_1\ h_3$ and $h_5$ are obtained from the outputs of the FIG. 17 MCM block.

Next, the 11-tap desensitized version of the 11-tap filter with data-rate expander is designed. The coefficients for the desensitized halfband structure are computed, using the formulae indicated in equations (8):

$$a_0=h_1+h_3+h_5=256$$

$$a_1=h_3+h_5=-46$$

$$a_2=h_5=7. \qquad (9)$$

A transposed-form desensitized structure is used to implement this filter. FIG. 20 depicts a desensitized transposed-form 11-tap halfband filter structure with data-rate expander 2000, according to embodiments of the present invention. Structure 2000 includes a delay loop 2010 having four one unit delays 2012*a-d* and three adders 2014*a-c*. Structure 2000 also includes three multipliers 2030*a-c* (which can be considered a "multiplier block" 2035 for ease of discussion), two sample-and-hold up-samplers 2085*a, b*, an adder 2045 and a one-unit delay 2015 coupled between adder 2045 and sample-and-hold up-sampler 2085*b*. Because filter structure 2000 is in transposed form, the B(z) block 2070 includes two one-unit delays 2075*a, b*.

It is possible to use Gustafsson's algorithm to obtain an optimal implementation for multiplier block 2035 that contains just two adders, as shown in FIG. 19. As described further below, the use of transposed-form structures is not actually necessary; that is, it is possible—for both the conventional halfband and for the desensitized halfband—to use a direct-form structure and to have the same numbers of adders employed as are required for the transposed-form structure.

Comparing the multiplier blocks implemented in these two implementations (depicted in FIGS. 17/18 and FIGS. 19/20), it can be concluded that the insensitivity of the new structure has allowed the desensitized implementation to reduce the required number of adders from four (FIG. 17) to two (FIG. 19). Similarly, by exploiting the new structure's insensitivity, it is possible to achieve at least a one-adder reduction in the implementation of each and every one of the filters given in Goodman.

In this regard, it is noted that all of the filters given in Goodman obey the $h_0=2(h_1+h_3+\ldots)$ constraint—a situation mentioned by Goodman, although it is not apparent that the connections given in the Theorem above were presented by Goodman nor was the consequence that the filters all possess the P(z) factor. Certainly Goodman does not mention the possibility of implementing the filters in a two-factor cascade, hence achieving the insensitivity.

An additional example from Goodman is considered. The 19-tap "baseband filter" of Goodman requires the tap-coefficients:

$$h_0=238, h_1=149, h_3=-46, h_5=22, h_7=\pm12, h_9=6.$$

Gustafsson I's algorithm obtains the optimal six-adder block shown in FIG. 21 for implementing this conventional 19-tap filter. In contrast, the desensitized version of this 19-tap halfband filter requires only the following five taps:

$$a_0=h_1+h_3+h_5+h_7+h_9=119$$

$$a_1=h_3+h_5+h_7+h_9=-30$$

$$a_2=h_5+h_7+h_9=16$$

$$a_3=h_7+h_9=-6$$

$$a_4=h_9=6$$

which can be implemented by the three-adder block shown in FIG. 22. Notice that all multiplier blocks are shown to implement only positive constants times the input X When a negative multiplier-value is required, a subtraction of the output is performed, rather than an addition, as the block outputs are entered into the larger structure.

Another advantage offered by the desensitized filter structure is that the smaller multiplier blocks obtained for the desensitized implementations also tend to have a smaller maximum tree depth. For example, the eleven-tap conventional filter example required a four-adder block with a depth-three tree (as shown in FIG. 17), while its desensitized counterpart required a two-adder depth-two adder tree (as shown in FIG. 19). In a further example, the 19-tap conventional filter example required a six-adder block with a depth-three tree (as shown in FIG. 21), while its desensitized counterpart required a three-adder depth-two adder tree (as shown in FIG. 22). The matter of tree depth is important because, if the tree-depth is too large, this can become a severe obstacle to obtaining a filter implementation that operates efficiently at a desired high data rate.

As described in Willson, another approach to the implementation of a desensitized halfband filter would be to factor the complete halfband prefilter polynomial $P(z)=(1+z^{-1})(1+z^{-1})$ out of the H(z) transfer function. That is:

$$H(z)=(1+z^{-1})(1+z^{-1})[q_6+q_5z^{-1}\ldots+q_5z^{-11}+q_6z^{-12}].$$

If this type of factorization is done for the 19-tap halfband filter just considered, the following results:

$$H(z)=(1+z^{-1})(1+z^{-1})\{[q_8(1+z^{-16})+q_6(z^{-2}+z^{-14})+q_4(z^{-4}+z^{-12})+q_2(z^{-6}+z^{-10})+q_0z^{-8}]+z^{-1}[q_7(1+z^{-14})+q_5(z^{-2}+z^{-12})+q_3(z^{-4}+z^{-10})+q_1(z^{-6}+z^{-8})]\}.$$

This yields the desensitized halfband filter shown in FIG. 31. Using the same "baseband filter" coefficient values, $$h_0=238, h_1=149, h_3=-46, h_5=22, h_7=-12, h_9=6$$

this leads (using equations like equations (2) of Willson) to the values:

$$q_8=6, q_7=-12, q_6=6, q_5=0, q_4=16, q_3=-32, q_2=2,$$
$$q_1=28, q_0=91$$

which, when built in two blocks ($\{q_0, q_2, q_4, q_6, q_8\}$ and $\{q_1, q_3, q_5, q_7\}$ and put into the "direct form," require a total of 5 adders to implement. But, while this is a savings from the 6 adders required by this filter as a conventional halfband, it is not as good as the three-adder block discussed above and shown in FIG. 22. Nonetheless, for other filters this factorization may prove advantageous and should be considered.

FIG. 31 depicts an alternate implementation of a desensitized 19-tap halfband filter structure 3100, according to embodiments of the present invention. Structure 3100 includes a delay loop 3110 having eight one unit delays 3112a-h. Structure 3100 also includes a $(1+z^{-1})(1+z-1)$ block 3102 coupled between the input and the delay loop 3110, nine multipliers 3130a-i, an adder 3145 and a one-unit delay 3115.

Implementing Larger Desensitized Signed-Power-of-Two Halfband Filters:

This section investigates the advantages of using the desensitized halfband filter structure for the implementation of larger halfband filters. The investigation begins with another example filter taken from a commercial product. The data sheet for the AD9776/AD9778/AD9779 by Analog Devices describes a 55-tap halfband interpolation filter (referred to herein as "ADI-55"). This halfband filter provides at least 87.5 dB attenuation over its stopband, the interval $0.6\pi \leq \omega \leq \pi$. As a benchmark, by using Gustafsson's algorithm, an optimal multiplier block that implements ADI-55 using 16 adders in an adder tree of depth six can be obtained. However, ADI-55 does not satisfy equation (6) above. Hence, the investigation must start with a new reference filter that does satisfy this condition, and then use it as the basis on which to design a desensitized counterpart.

Using linear programming techniques, another 55-tap halfband filter is designed (referred to herein as "ANW-55"). ANW-55 has slightly better stopband attenuation then ADI-55, over the same stopband (the interval $0.6\pi \leq \omega \leq \pi$), and it satisfies equation (6). ANW-55 requires an implementation complexity comparable to ADI-55, as illustrated in Table 1 below.

TABLE 1

|  | ADI-55 | ANW-55 | Desensitized-55 |
|---|---|---|---|
| Stopband att. | 87.5 dB | 89 dB | 89.1 dB |
| Adds required | 16 | 17 | 13 |
| tree depth | 6 | 5 | 5 |

The ANW halfband filter is then used to design a desensitized halfband filter, "Desensitized-55," which is also summarized in Table 1. Not only is the Desensitized-55 filter implemented with three fewer adders than ADI-55, it has better stopband attenuation (by more than 1.5 dB) and its tree depth is just five. The 13-adder tree for Desensitized-55—again obtained via Gustafsson's algorithm—is shown in FIG. 23. In FIG. 23, the depth of each adder is indicated next to the adder. That is, adders 2340a and b are at depth 1; adders 2340c, d, and e are at depth 2; adders 2340f, g, and h are at depth 3; adders 2340i and j are at depth 4; and adders 2340k, l, and m are at depth 4. Furthermore, Gustafsson's algorithm can be used in an alternate mode that finds an adder-tree with 15 adders, but having a maximum depth of just three. Situations can exist wherein one may prefer to pay a small price, such as using two additional adders, to obtain a reduced tree depth.

The actual design of ANW-55, and then Desensitized-55, was performed by a procedure which started with a 55-tap halfband filter whose stopband attenuation exceeded the target 87.5 dB of ADI-55. This design was performed using linear programming. The taps of the filter ANW-55 were computed as floating-point real numbers. They were rounded to 25-bit values that met the requirements of equation (6). These were then converted via the formulae indicated by equations (8) into the tap values of the desensitized structure.

Now, both sets of 25-bit coefficients (for the conventional filter and the desensitized filter) were manipulated via an ad hoc procedure:

They were written in SPT form. Then, repeatedly, certain nonzero LSBs were deleted until a combination of remaining bits in the set of coefficients was found for which the stopband attenuation was suitable (i.e., better than that of ADI-55). Due to the structure's insensitivity, the set of coefficients that would ultimately yield Desensitized-55 was found to permit the deletion of LSBs having larger bit-weights than those in the set of coefficients that would yield ANW-55. Thus, it was possible to remove more nonzero LSBs from the desensitized coefficient set than could be removed from the set yielding ANW-55. When it was judged that the best coefficients had been found, the use of Gustafsson's algorithm confirmed that these fewer SPT terms in the Desensitized-55 design correlated well with the requiring of fewer additions than in the traditional structure, ANW-55. Most significantly, Desensitized-55 was superior to ADI-55 as indicated in Table 1. It was deemed coincidental that the stopband attenuation of Desensitized-55 turned out to be slightly better than that of ANW-55.

A Further Large-Filter Example

This section considers one final reasonably large halfband filter whose implementation can be improved by employing the desensitized halfband filter structure. This is a 47-tap halfband filter whose design is reported in A. Y. Kwentus, Z. Jiang, and A. N. Willson, Jr., "Application of filter sharpening to cascaded integrator-comb decimation filters," *IEEE Trans. Signal Processing*, vol. 45, pp. 457-467, February 1997 [Kwentus], which is incorporated by reference in its entirety, where it is called a "Third Halfband Filter," (referred to herein as "THF"). The minimum stopband attenuation of the THF is approximately 73.1 dB.

As in the case of ADI-55, the THF tap coefficients did not satisfy equation (6). Thus, the design proceeded in a manner similar to that described above. The process began with an over-designed halfband filter whose 47 tap coefficients did satisfy equation (6). Those coefficients were quantized and transformed into the coefficients of a desensitized halfband structure using SPT coefficient representation. What appeared to be an optimal set of nonzero LSBs were found that could be omitted while still keeping the minimum stopband attenuation greater than 73.1 dB. The result of this process was a 47-tap halfband filter "Desensitized-47" that achieves a minimum stopband attenuation of approximately 73.38 dB and that requires a depth-three adder tree having just ten adders.

This compares favorably to the 16 adders in a depth-five tree that, according to Gustafsson's algorithm, are required to realize the coefficients of THF given in Kwentus. That is, the resulting desensitized halfband filter architecture provides a $(16-10)/16 \Rightarrow 37.5\%$ reduction in adders. FIG. 24 illustrates the SPT terms of the coefficients of THF (given in Kwentus) and FIG. 25 illustrates the SPT coefficients of Desensitized-47, according to embodiments of the present invention. It is evident that fewer SPT terms are required for Desensitized-47 and that, generally, the bit-weights of the terms are larger than those of THF—for example, among all taps of Desensitized-47 there is only one SPT term having a weight as small as $2^{-15}$ while the taps of THF employ three SPT terms with weight $2^{-15}$ as well as four SPT terms having weight $2^{-16}$. The need for smaller bit-weight terms in THF is surely a reflection of the structure's higher sensitivity to the coefficient values.

The "trellis-search" type design techniques given in C-L. Chen and A. N. Willson, Jr., "A trellis search algorithm for the design of FIR filters with signed-powers-of-two coefficients," *IEEE Trans. Circuits Syst.-II*, vol. 46, pp. 29-39, January 1999 [Chen], which is incorporated herein by reference in its entirety, can also be extended to the new class of desensitized halfband filters in order to create an easier, more systematic, and better method of performing the type of design discussed here for the 47-tap and 55-tap examples. The design successes obtained by the present ad hoc methods provide considerable encouragement that a more systematic process stemming from Chen is likely to yield excellent halfband filter designs that exploit the advantages inherent within the desensitized structure to obtain significant reductions in hardware complexity. Other design techniques may also yield improved methods of performing the type of design discussed here, one example being M. Aldan, A. Yurdakul, and G. Dundar, "An algorithm for the design of low-power hardware-efficient FIR filters," *IEEE Trans. Circuits Syst.-I*, vol. 55, pp. 1536-1545, July 2008 [Aktan], which is incorporated herein by reference in its entirety.

Converting Transposed-Form Halfband Filters into Direct-Form Filters

Both the direct and transposed forms of FIR filter implementation have their own relative advantages and disadvantages. For example, if a design goal is the maximization of operating speed, then a direct-form filter can exhibit the disadvantage of having a longer critical path than that of its transposed-form counterpart. (As shown in FIG. 26, the former must accomplish one multiplication and many successive additions in its critical path, while the transposed-form filter has a critical path consisting of just one multiplication and one addition.) One the other hand, if the minimization of power consumption is a design goal, along with achieving a high operating speed, the use of carry-save adders in the transposed-form filter can require additional power consumption due to a doubling of the number of registers needed to implement the filter's delay chain (in comparison to the delay chain of the direct-form filter) because both carry and sum values would require delaying as each adder's output value is sent toward the next adder.

Thus, if possible, it is important for a designer to have the option of choosing either the direct form or the transposed form for the physical implementation of an FIR filter. Fortunately, it is known from O. Gustafsson and A. G. Dempster, "On the use of multiple constant multiplication in polyphase FIR filters and filter banks," in *Proc. Nordic Signal Process. Symp.*, June 2004, pp. 53-56 [Gustafsson III], which is incorporated herein by reference in its entirety, that, when implementing an FIR filter that uses an MCM block architecture—e.g., by using Gustafsson's algorithm—this implementation can be accomplished in either the direct or transposed form while incurring the same overall adder expense. Hence, if an adder tree for a transposed-form FIR filter is obtained, it can be "operated backwards" and the resulting multi-input/single-output block can be employed in a direct-form version of the same filter. Moreover, even though the transposed block will be one in which adder nodes are transformed into branch nodes and vice versa, the total number of adders required in the direct-form filter will exactly equal the total number of adders required in the transposed-form filter. The term "total number" is used here because it is important to include all adders needed in the summing up of the various paths in both structures. For example, while the three adders (2640*a*, *b*, and *c*) shown in the direct-form implementation of FIG. 26A will be absorbed into its transposed MCM block, the three adders (2645*a*, *b*, and *c*) appearing in the transposed-form implementation of FIG. 26B will remain external to its MCM block. However, these three adders must be added to the number of adders appearing inside the transposed-filter's MCM block to obtain the total number of adders for the transposed-form filter.

As mentioned above, the result that the same adder expense occurs in both direct- and transposed-form filters is not new. One can, however, easily establish it as follows:

We actually prove that if a graph contains only two-input adder nodes and two-output branch nodes, and if the graph has exactly one input node and exactly one output node, then the total number of branch nodes equals the total number of adder nodes.

Proof: Without loss of generality, the graph can be put into the form of an array of B branch nodes and S sum nodes, as shown in FIG. 27. The array has B+2S input terminals at the bottom and 2B+S output terminals at the top. The graph is constructed by interconnecting an output (top) terminal with an input (bottom) terminal. All terminals will be connected this way (since there is no need for a one-output branch node or a one-input sum node) except for one input terminal and one output terminal, and these will be the system input and system output. Let C denote the number of interconnecting wires. Then 2B+C=1 and B+2S−C=1. Subtracting both sides of these equations from each other yields B=S. Q.E.D. (A proof given in Gustafsson III treats a somewhat more general result.)

In converting an FIR filter into a graph for the purposes of this discussion, the $z^{-1}$ delay blocks are simply "short-circuited". This yields the desired one-input/one-output graph consisting of an interconnection of the terminals of the B and S nodes. When the system contains data rate expanders, these essentially get short circuited too. It is, however, simpler to just move them back out of the filter, then the filter and its transpose can be compared to one another directly.

To illustrate the invariance of the number of adders when comparing direct-form and transposed-form filters, or, equivalently, the overall equality in the number of branch nodes and sum nodes, consider the example of the MCM tree of FIG. 19. When it is used in the transposed-form system of FIG. 20, two of its outputs encounter a branch node and then three such branches feed sum nodes. Hence, the complete graph of the system has 4+4=8 branch nodes (4 being internal to the MCM block) and 2+6=8 sum nodes (2 being internal to the MCM block). In particular, there are 8 adders.

FIG. 28 depicts the transpose of the FIG. 19 multiplier block. Notice that it is trivially constructed by replacing branch nodes in FIG. 19 with sum nodes, and vice versa. The roles of input and output nodes are also reversed. Clearly there are 4 sum nodes (2840a-d) and 2 branch nodes (2850a, b).

FIG. 29 depicts an implementation of a desensitized 11-tap filter 2900, according to embodiments of the present invention. Implementation 2900 has a similar structure to the alternate implementation of the desensitized 15-tap filter described above in FIG. 10. Implementation 2900 also includes an input block 2990, a delay loop 2910, a multiplier block 2935, adder 2940a, adder 2940b, and a $(1+z^{-1})$ block 2960.

Input block 2990 includes a one unit delay 2992, two adders 2994 a, b, and two two unit delays 2995a and b. In block 2990, adder 2994a subtracts an input sample delayed by $z^{-1}$ from the present input sample to produce $X(z)(1-z^{-1})$ which is fed as an input into the delay loop 2910 and as input into adder 2940a. Adder 2994b adds an input sample delay by $z^{-1}$ to the present input sample to produce $X(z)(1+z^{-1})$ which is fed through the two delays 2995a and b.

Delay loop 2910 includes four two unit delays 2912a-d. Multiplier block 2935 includes three multipliers 2930a, b,
and c. The outputs of multipliers 2930a, b, and c are combined by adders 2940c and d. The output of adder 2940d is fed as an input to the $(1+z^{-1})$ block 2960.

When the block of FIG. 28 is used in the 11-tap direct-form desensitized system of FIG. 29, the overall system has 4+4=8 sum nodes and 2+6=8 branch nodes. Again, in particular, there are 8 adders.

Although it was not required for the present analysis, FIG. 28 shows the value of the block's output as a function of its inputs A, B, C. Clearly, it transposes the FIG. 19 Input/Output relation.

Important Observation Regarding the FIG. 9 System:

When transposing the MCM-block that is suitable for the transposed-form structure of FIG. 13, to create a block that can be used in a direct-form realization, the block obtained is appropriate for the FIG. 10 type structure. However, when the halfband filter is built as a direct-form filter, the FIG. 9 type architecture (or its FIG. 12 variant) is preferable since it does not include the extra $z^{-1}$ blocks located at the bottom of FIG. 10. (Moreover, if the direct-form filter is intended for use in an up-sampling system, the FIG. 10 filter is not easy to "move back" through the up-sampler, due to the presence of the $z^{-1}$ block at the input.) Fortunately we are not necessarily stymied here.

When the center tap $h_0$ of the desired halfband filter equals ½, as it usually would, then the value of $a_0$ becomes ¼ (because of equations (6) and (8)). Thus, the $a_0$ tap's implementation becomes trivial; no adders are required. Hence, both of the FIG. 9 and FIG. 10 structures can be built with the same number of adders and the MCM block that is suitable for FIG. 10 is easily adapted for use in FIG. 9. FIG. 30(a) shows the detailed realization 3000A of the transposed form FIG. 13 realization and FIG. 30(b) shows the detailed realization 3000B of the direct form FIG. 12 realization. Notice that both FIG. 30(a) and FIG. 30(b) employ a total of 8 adders each.

It is also useful to mention that, while tap coefficients have been normalized to have integer values for most of the discussion herein, it is straightforward to re-scale them to have fractional values, as will likely be preferable for practical implementation. The fractional tap coefficients for the FIG. 30(b) circuit are the $a_k$ values given in equations (9), but divided by 1024 (so that $a_0$=¼). That is, we want:

$$a_0 = 1/4$$

$$a_1 = -46/1024$$

$$a_2 = 7/1024. \quad (10)$$

By starting at the left side of FIG. 28, and pushing a 10-bit right-shift operator through the transposed tree, any one of several equivalent structures can be obtained that each implement the desired re-scaled system and that only involve right-shifts. This process leads to, for example, FIG. 30(c), which is a re-scaled version 3000C of FIG. 30(b) that employs the fractional coefficients of equations (10).

Halfband Decimation Filters

In addition to a halfband filter's use in combination with data-rate expanders, halfband filters may also be used along with decimators in systems wherein an input signal's data rate is lowered. In such systems the input data must be lowpass filtered prior to the decimation operation so as to avoid creating so-called aliasing components in the output data. FIG. 34 shows the operation of a decimator that down-samples an input sequence by a factor of two by omitting every other input sample. FIG. 34A shows this operation in the time domain. Unfortunately, while the expected result is produced for the low-frequency part of the input spectrum, the high-frequency part of the input not only "gets through" the decimator, it gets moved (aliased) into the lower frequency spectrum as shown in FIG. 34C. Notice that the manner in which high frequencies are mapped into the lower frequency range is by a "folding" of the high frequencies around the $\omega=\pi/2$ point, as illustrated in FIGS. 34B and C. (A frequency $\omega_1$ within the interval $(\pi/2, \pi]$ is mapped to the frequency $\pi-\omega_1$.) To avoid this aliasing, we must lowpass-filter the input signal before the decimation operation. This is shown in FIG. 34B, where a halfband filter is used.

FIG. 34D depicts a down-sampler system 3400 that includes a filter 3420 and a decimator 3430. For down-sampling systems employing the halfband filter and decimator combination of FIG. 34D, it is well known to move filter components forward, through the decimator, if possible, enabling the operation of much of the filter hardware at the lower sample rate. For the desensitized halfband filter, the filters of FIGS. 10 and 29 are particularly suitable for such halfband/decimator combinations. FIG. 35 shows an example of such a combination that is based on the use of the FIG. 29 11-tap halfband filter and FIG. 36 shows a transposed-form realization of the same halfband/decimator combination.

FIG. 35 depicts an implementation of a desensitized 11-tap filter implemented in combination with a decimator 3500, according to embodiments of the present invention. Implementation 3500 includes an input block 3590, a delay loop 3510, and a multiplier block 3535.

Input block 3590 includes a $(1+z^{-1})$ block 3565, two decimators 3595$a$,$b$, a one unit delay 3592, two adders 3594$a$, $b$, and two one-unit delays 3575$a$, $b$. The output of $(1+z^{-1})$ block 3565 is fed as input to decimator 3595$a$ and as input to delay 3592. The output of delay 3592 is fed as input to decimator 3595$b$. In block 3590, adder 3594$a$ subtracts the output of decimator 3595$b$ from the output of decimator 3595$a$. Adder 3594$b$ adds the output of decimator 3595$b$ to the output of decimator 3595$a$.

Delay loop 3510 includes four two unit delays 3512$a$-$d$. Multiplier block 3535 includes three multipliers 3530$a$, $b$, and $c$. The output of adder 3540$a$ is fed as input to multiplier 3530$a$ and the output of adder 3540$b$ is fed as input to multiplier 3530$b$. The outputs of multipliers 3530$a$, $b$, and $c$ are combined by adders 3540$c$ and $d$.

For systems implemented with desensitized halfband/decimator combinations, it is of interest to consider the implications of the presence or absence of the equation (6) relation: $h_0=2(h_1+h_3+\ldots)$. By the Theorem of Section 3, this relation is equivalent to $|H(e^{j\omega})|=0$ at $\omega=\pi$ which, in fact, means that the halfband filter must possess a double zero at $\omega=\pi$. A zero at $\omega=\pi$ will completely eradicate any spectral component of the $X(e^{j\omega})$ input signal at the input's Nyquist frequency, which is the frequency that the decimator would otherwise cause to become aliased directly onto the DC value of the spectrum of the output signal $Y(e^{j\omega})$. In fact, the presence of a double zero at $\omega=\pi$ will tend to have a strong attenuating influence on all frequencies near the input's Nyquist frequency.

As is well known in the use of so-called CIC filters due to E. B. Hogenauer, "An economical class of digital filters for decimation and interpolation," *IEEE Trans. Acoust., Speech, Signal Processing*, vol. ASSP-29, pp. 155-162, April 1981 [Hogenauer], which is incorporated by reference in its entirety, such well-placed transmission zeros can significantly and efficiently protect low-frequency input signal components in a down-sampling system wherein the information contained in these components is particularly important and must be protected from corruption by unwanted aliasing. Such situations may include ones wherein the halfband/decimator circuit is but the first stage of a multi-stage down-sampling operation. Thus, as in the up-sampling application, the equation (6) relation is quite likely one that is desirable for reasons quite apart from its being required by our desensitized halfband filter structures.

Halfband-Like Filters

While the discussion thus far has focused on the design of halfband filters, there is another somewhat similar type of filter that can potentially benefit from the present invention. It has been called a "halfband-like filter" in O. Gustafsson, L. S. DeBrunner, V. DeBrunner, and H. Johansson, "On the design of sparse half-band like FIR filters," in *Proc. Asilomar Conf. Signals, Syst., Comp.*, 2007, pp. 1098-1102 [Gustafsson IV], which is incorporated herein by reference in its entirety. Such filters have transfer functions whose magnitude $|H(e^{j\omega})|$ does not possess a halfband filter's precise odd-symmetry about the $\omega=\pi/2$ value, as discussed above in Section I. All halfband filters must have their passband and stopband aligned as shown in FIG. 32. Notice that the passband ripple $\pm\delta_1$ must be exactly equal to the stopband ripple $\pm\delta_2$ and the passband edge $\omega_p$ and the stopband edge $\omega_s$ must be symmetrically located around $\omega=\pi/2$. Halfband-like filters deviate somewhat from these requirements. One situation in which a halfband-like filter could be superior to a halfband filter is where one needs a certain minimum amount of stopband attenuation, say 80 dB, but one does not need the accompanying extremely small passband ripple that the halfband filter's odd-symmetry dictates—in this case, approximately $\pm 0.0009$ dB. A "halfband-like" filter can be designed, wherein the passband ripple is specified to be, say, $\pm 0.01$ dB while the stopband is required to keep an 80-dB minimum amount of stopband attenuation. Thus, we have $\delta_1 \approx 0.00115$ while $\delta_2 \approx 0.0001$—which means that $\delta_1 \approx 11.5 \times \delta_2$. Here the passband and the stopband edges are positioned so as to maintain the symmetric locations that they would have if the filter were a true halfband filter. It is, of course, possible to envision a situation wherein the $\omega_p+\omega_s=\pi$ halfband requirement is relaxed somewhat while the equality of passband and stopband ripples is maintained—or even a situation wherein both types of relaxation are performed while not deviating excessively from a halfband filter's transfer function. For all such halfband-like filters, it could be efficient to create the filter in a manner wherein a prefilter is placed in cascade with another filter, as in the halfband-filter designs that we have already illustrated in detail. For example, a scaled version of the smallest halfband filter $P(z)=(1+z^{-1})(1+z^{-1})$ could be employed and the halfband-like filter transfer function $H(z)$ designed according to the relation $H(z)=P(z)G(z)$.

Clearly, the cheaply built halfband filter $P(z)$ can provide a coarse approximation to the desired halfband-like transfer function, and the cascade implementation could inherit benefits due to the insensitivity of the overall transfer function $H(z)$ to perturbations in the parameters of the transfer function $G(z)$, as has been demonstrated above in the case of halfband filters $H(z)$. By deviating from the strict halfband frequency-domain requirements, it will happen that the halfband-like filters will no longer have alternate tap multiplier coefficients of value zero. Nonetheless, the enhanced insensitivity could still permit some hardware savings to occur through efficient MCM tree savings and it may even be possible to meet the less-demanding frequency-domain design constraints with a lower degree transfer function $H(z)$ than would be possible when using a true halfband filter.

IIR Halfband Filters

In addition to the FIR halfband filters that have been discussed herein, it is well known that halfband filters can be built in IIR form. The major difference between FIR halfband filters and IIR halfband filters is the fact that the former are described by a transfer function that can be put into the form of a polynomial in the variable $z^{-1}$ while the transfer function of an IIR halfband filter is a rational function in $z^{-1}$. That is, in terms of the complex variable z, the transfer functions of both an FIR and an IIR filter can be put into the form of a function constructed as a numerator polynomial in z divided by a denominator polynomial in z, where the roots of the numerator polynomial are the transfer function's zeros and the roots of the denominator polynomial are the transfer function's poles. While system stability demands that all poles lie within the unit circle of the z-plane, the distinguishing feature of an FIR filter is that all of its poles will be located at the origin, i.e., at z=0, while a stable IIR filter will have poles located at points other than z=0, although still within the unit-circle. Design methods for IIR halfband filters can be found in S. K. Mitra, Digital Signal Processing., 3$^{rd}$ ed. New York: McGraw-Hill, 2006, Section 13.6.5, pp. 787-790. [Mitra], which is incorporated herein by reference in its entirety, and in M. Renfors and T. Saramaki, "Recursive n-th band digital filters, Parts I and II," *IEEE Trans. Circuits and Systems*, vol. CAS-34, pp. 24-51, January 1987 [Renfors], which is incorporated by reference in its entirety, and elsewhere.

The presence of nonzero poles for an IIR filter does not interfere with the possibility of organizing the transfer function in a way such that it possesses at least two zeros at z=−1. Therefore, it is evident that the same kind of desensitizing advantages that have been exhibited for FIR halfband filters can be achieved as well by IIR halfband filters.

An example of an IIR filter design is presented in R. Yamashita, X. Zhang, T. Yoshikawa, and Y. Takei, "Design of IIR half-band filters with arbitrary flatness and its application to filter banks," *Electronics and Communications in Japan*, Part 3, vol. 87, No. 1, pp. 134-141, 2004 [Yamashita], which is incorporated by reference in its entirety, wherein the halfband filter's transfer function has the pole/zero plot shown in FIG. 37, where it is shown that the filter's transfer function has nine zeros at z=−1. If, in the building of such a filter, one or two of these zeros were factored out of the numerator polynomial, and then the overall transfer function was expressed in terms of the remaining numerator polynomial coefficients (as in the FIR examples considered above using the $a_k$ or $q_k$ coefficients) this would clearly lead to expressions for the transfer function value that would be less sensitive to these parameters than would be the transfer function sensitivity to the coefficients of the complete numerator polynomial.

Discrete-Time Hilbert Transformer

It is well known that a very simple relationship exists between FIR halfband filters and discrete-time Hilbert transformers. In Mitra, Section 15.7, pp. 893-899. [Mitra2], which is incorporated herein by reference in its entirety, it is shown that a discrete-time Hilbert transformer $H(e^{j\omega})$ is related to a halfband filter $G(e^{j\omega})$ by a rather simple relationship, namely:

$$G(e^{j\omega}) = \frac{1}{2}H(e^{j(\omega+\pi/2)}) = \begin{cases} 1, & \text{for } 0 < |\omega| < \frac{\pi}{2} \\ 0, & \text{for } \frac{\pi}{2} < |\omega| < \pi. \end{cases}$$

The relationship between the tap coefficients of G and H is shown in H. W. Schussler and P. Steffen, "Halfband filters and Hilbert transformers," *Circuits Systems Signal Processing*, vol. 17, no. 2, pp. 137-164, 1998 [Schussler], which is incorporated by reference in its entirety. Given the halfband filter G, the Hilbert transformer H is obtained by getting the tap coefficients of H from:

$$H(z) = \sum_{k=-N}^{N} h_k z^{-k} = 2 \sum_{n=-\lfloor N/2 \rfloor-1}^{\lfloor N/2 \rfloor} (-1)^n g_{2n+1} z^{-(2n+1)}$$

which, specifically implies $$h_k = \begin{cases} 0 & \text{for } k = 2n \\ 2(-1)^n g_k & \text{for } k = 2n+1, -\lfloor N/2 \rfloor - 1 \le n \le \lfloor N/2 \rfloor. \end{cases}$$

These relations show that one can build a desensitized discrete-time Hilbert transformer by directly mapping the taps of a corresponding desensitized halfband filter via the well-known relationships given above, and elsewhere.

III. Exemplary Computer System

Embodiments of the invention may be implemented using hardware, programmable hardware (e.g., FGPA), software or a combination thereof and may be implemented in a computer system or other processing system. In fact, in one embodiment, the invention is directed toward a software and/or hardware embodiment in a computer system. An example computer system 3802 is shown in FIG. 38. The computer system 3802 includes one or more processors, such as processor 3804. The processor 3804 is connected to a communication bus 3806. The invention can be implemented in various software embodiments that can operate in this example computer system. After reading this description, it will become apparent to a person skilled in the relevant art how to implement the invention using other computer systems and/or computer architectures.

Computer system 3802 also includes a main memory 3808, preferably a random access memory (RAM), and can also include a secondary memory or secondary storage 3810. The secondary memory 3810 can include, for example, a hard disk drive 3812 and a removable storage drive 3814, representing a floppy disk drive, a magnetic tape drive, an optical disk drive, etc. The removable storage drive 3814 reads from and/or writes to a removable storage unit 3816 in a well known manner. Removable storage unit 3816, represents a floppy disk, magnetic tape, optical disk, etc. which is read by and written to by removable storage drive 3814. As will be appreciated, the removable storage unit 3816 includes a computer usable storage medium having stored therein computer software and/or data.

In alternative embodiments, secondary memory 3810 may include other similar means for allowing computer software and data to be loaded into computer system 3802. Such means can include, for example, a removable storage unit 3820 and an storage interface 3818. Examples of such can include a program cartridge and cartridge interface (such as that found in video game devices), a removable memory chip (such as an EPROM, or PROM) and associated socket, and other removable storage units 3820 and interfaces 3818 which allow software and data to be transferred from the removable storage unit 3820 to the computer system 3802.

Computer system 3802 can also include a communications interface 3822. Communications interface 3822 allows software and data to be transferred between computer system 3802 and external devices 3826. Examples of communications interface 3822 can include a modem, a network interface (such as an Ethernet card), a communications port, a PCMCIA slot and card, etc. Software and data transferred via communications interface 3822 are in the form of signals, which can be electronic, electromagnetic, optical or other signals capable of being received by the communications interface 3822. These signals are provided to the communications interface 3822 via a channel 3824. This channel 3824 can be implemented using wire or cable, fiber optics, a phone line, a cellular phone link, an RF link and other communications channels.

Computer system 3802 may also include well known peripherals 3803 including a display monitor, a keyboard, printers and facsimile, and a pointing device such a computer mouse, track ball, etc. In this document, the terms "computer program medium" and "computer usable medium" are used to generally refer to media such as the removable storage devices 3816 and 3818, a hard disk installed in hard disk drive 3812, and semiconductor memory devices including RAM and ROM. These computer program products are means for providing software (including computer programs that embody the invention) and/or data to computer system 3802.

Computer programs (also called computer control logic or computer program logic) are generally stored in main memory 3808 and/or secondary memory 3810 and executed therefrom. Computer programs can also be received via communications interface 3822. Such computer programs, when executed, enable the computer system 3802 to perform the features of the present invention as discussed herein. In particular, the computer programs, when executed, enable the processor 3804 to perform the features of the present invention. Accordingly, such computer programs represent controllers of the computer system 3802.

In an embodiment where the invention is implemented using software, the software may be stored in a computer program product and loaded into computer system 3802 using removable storage drive 3814, hard drive 3812 or communications interface 3822. The control logic (software), when executed by the processor 3804, causes the processor 3804 to perform the functions of the invention as described herein.

In another embodiment, the invention is implemented primarily in hardware using, for example, hardware components such as application specific integrated circuits (ASICs), stand alone processors, and/or digital signal processors (DSPs). Implementation of the hardware state machine so as to perform the functions described herein will be apparent to persons skilled in the relevant art(s). In embodiments, the invention can exist as software operating on these hardware platforms.

In yet another embodiment, the invention is implemented using a combination of both hardware and software.

CONCLUSION

While various embodiments of the present invention have been described above, it should be understood that they have been presented by way of example, and not limitation. It will be apparent to persons skilled in the relevant art(s) that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A digital filter comprising: a first filter including a delay loop coupled to a plurality of multipliers and having a transfer function G(z) of degree greater than one; and a second filter implemented in hardware and having a transfer function $F(z)=K \cdot (1+z^{-1})$ where $K \neq 0$, wherein the first filter and the second filter are coupled in cascade to make a filter having a transfer function $H(z)=F(z) \cdot G(z)$, with H(z) being a transfer function of a halfband filter.

2. The digital filter of claim 1, wherein the first filter is a finite impulse response (FIR) filter.

3. The digital filter of claim 1, wherein the second filter includes an additional $(1+z^{-1})$ block.

4. The digital filter of claim 1, wherein the digital filter interacts with an up-sampler.

5. The digital filter of claim 4, wherein the up-sampler is a sample-and-hold up-sampler.

6. The digital filter of claim 1, wherein the digital filter interacts with a down-sampler.

7. The digital filter of claim 1, wherein the first filter includes:
a multiplier block coupled to the delay loop; and
a plurality of adders coupled between the delay loop and the multiplier block.

8. The digital filter of claim 7, wherein the multiplier block includes a plurality of filter multipliers, each having a corresponding multiplier coefficient.

9. The digital filter of claim 8, wherein each of the multiplier coefficients is calculated using at least one coefficient in a transfer function of the digital filter.

10. The digital filter of claim 7, wherein the multiplier block includes:
a plurality of adders; and
a plurality of shift elements.

11. The digital filter of claim 10, wherein the multiplier block is configured to generate a plurality of output values.

12. The digital filter of claim 1, wherein the digital filter is a finite impulse response (FIR) filter.

13. The digital filter of claim 1, wherein the digital filter is an infinite impulse response (IIR) filter.

14. The digital filter of claim 1, wherein the digital filter is a halfband-like filter.

15. A Hilbert transformer, comprising: a first FIR filter including a delay loop coupled to a plurality of multipliers and having a transfer function G(z) of degree greater than one whose filter-tap coefficients have absolute values equal to sums of one or more filter-tap coefficients of said Hilbert transformer, and a second filter implemented in hardware and having a transfer function $F(z)=K \cdot (1+z^{-1})$ where $K \neq 0$, wherein the first filter and the second filter are coupled in cascade to make a filter having a transfer function $H(z)=F(z) \cdot G(z)$, with H(z) being a transfer function of the Hilbert transformer.

16. A digital filter comprising: a first filter configured to provide a coarse approximation of a desired transfer function for the digital filter, the first filter including a delay loop coupled to a plurality of multipliers and having a transfer function G(z) of degree greater than one; and a second filter coupled to the first filter in cascade, wherein the second filter has a transfer function $F(z)=K \cdot (1+z^{-1})$ where $K \neq 0$ and is configured to compensate for the coarse approximation of the first filter, wherein $H(z)=G(z) \cdot F(z)$, with H(z) being a transfer function of a halfband filter.

17. The digital filter of claim 16 wherein the first filter is an FIR filter.

18. The digital filter of claim 16, wherein the second filter includes an additional $(1+z^{-1})$ block.

19. The digital filter of claim 16, wherein the digital filter interacts with an up-sampler.

20. The digital filter of claim 19, wherein the up-sampler is a sample-and-hold up-sampler.

21. The digital filter of claim 16, wherein the digital filter interacts with a down-sampler.

22. A method for filtering an input signal in a digital filter having a first filter, implemented in hardware, and a second filter, implemented in hardware, coupled in cascade, comprising:
filtering the input signal in the first filter to produce a first filter output signal, wherein the first filter includes a delay loop coupled to a plurality of multipliers and has a transfer function G(z) of degree greater than one; and filtering the first filter output signal in the second filter having a transfer function $F(z)=K \cdot (1+z^{-1})$ where $K \neq 0$ to produce an output signal of the digital filter, wherein the digital filter has a transfer function $H(z)=F(z) \cdot G(z)$, with H(z) being a halfband filter.

23. The method of claim 22, wherein filtering the input signal in the first filter includes filtering using an FIR filter.

24. The method of claim 22, wherein filtering the first filter output signal includes filtering using the second filter having an additional $(1+z^{-1})$ block.

25. The method of claim 22, further comprising: receiving said input signal of a digital filter from an up-sampler.

26. The method of claim 25, wherein the up-sampler is a sample-and-hold up-sampler.

27. The method of claim 22, further comprising: down-sampling said digital filter output.

28. The method of claim 22, wherein filtering the input signal in the first filter includes producing a coarse approximation of a set of characteristics of a desired output signal for the digital filter.

29. A method for filtering an input signal in a Hilbert transformer, comprising:
filtering the input signal in a first FIR filter including a delay loop coupled to a plurality of multipliers. and having a transfer function G(z) of degree greater than one with filter-tap coefficients whose absolute values equal sums of one or more filter-tap coefficients of said Hilbert transformer; and filtering the first filter output signal in a second filter implemented in hardware and having transfer function $F(z)=K \cdot (1+z^{-1})$ where $K \neq 0$, such that $G(z) \cdot F(z)$ is the transfer function of a Hilbert transformer.

30. A method for filtering an input signal in a Hilbert transformer, comprising:
filtering the input signal in a first filter implemented in hardware and having a transfer function $F(z)=K \cdot (1+z^{-1})$ where $K \neq 0$, to produce a first filter output signal; and filtering the first filter output signal in an FIR implemented in hardware and including a delay loop coupled to a plurality of multipliers, and having a transfer function G(z) of degree greater than one with filter-tap coefficients whose absolute values equal sums of one or more filter-tap coefficients of said Hilbert transformer, such that $F(z) \cdot G(z)$ is the transfer function of a Hilbert transformer.

* * * * *

UNITED STATES PATENT AND TRADEMARK OFFICE
CERTIFICATE OF CORRECTION

| | | |
|---|---|---|
| PATENT NO. | : 8,645,441 B2 | Page 1 of 1 |
| APPLICATION NO. | : 12/185062 | |
| DATED | : February 4, 2014 | |
| INVENTOR(S) | : Alan N. Willson, Jr. | |

It is certified that error appears in the above-identified patent and that said Letters Patent is hereby corrected as shown below:

Title page, item (12), please replace "Willson" with --Willson, Jr.--.

Title page, item (75), please replace "Willson" with --Willson, Jr.--.

Signed and Sealed this
Twelfth Day of August, 2014

Michelle K. Lee
*Deputy Director of the United States Patent and Trademark Office*